United States Patent
Ohba et al.

(10) Patent No.: US 10,804,321 B2
(45) Date of Patent: Oct. 13, 2020

(54) SWITCH DEVICE AND STORAGE UNIT

(71) Applicant: SONY SEMICONDUCTOR SOLUTIONS CORPORATION, Kanagawa (JP)

(72) Inventors: Kazuhiro Ohba, Tokyo (JP); Hiroaki Sei, Kanagawa (JP); Seiji Nonoguchi, Kanagawa (JP); Takeyuki Sone, Kanagawa (JP); Minoru Ikarashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/534,062

(22) Filed: Aug. 7, 2019

(65) Prior Publication Data
US 2019/0363134 A1    Nov. 28, 2019

Related U.S. Application Data

(63) Continuation of application No. 15/559,571, filed as application No. PCT/JP2016/058389 on Mar. 16, 2016, now Pat. No. 10,403,680.

(30) Foreign Application Priority Data

Mar. 31, 2015 (JP) ................. 2015-073053

(51) Int. Cl.
| | |
|---|---|
| *H01L 47/00* | (2006.01) |
| *H01L 27/24* | (2006.01) |
| *H01L 27/105* | (2006.01) |
| *H01L 27/22* | (2006.01) |
| *H01L 45/00* | (2006.01) |

(52) U.S. Cl.
CPC ........ *H01L 27/2427* (2013.01); *H01L 27/105* (2013.01); *H01L 27/224* (2013.01); *H01L 45/06* (2013.01); *H01L 45/065* (2013.01); *H01L 45/085* (2013.01); *H01L 45/1233* (2013.01); *H01L 45/1266* (2013.01); *H01L 45/142* (2013.01); *H01L 45/143* (2013.01); *H01L 45/144* (2013.01); *H01L 45/145* (2013.01); *H01L 45/146* (2013.01)

(58) Field of Classification Search
CPC ... H01L 27/2427; H01L 27/105; H01L 45/00; H01L 45/065; H01L 45/1233; H01L 45/1266; H01L 45/142; H01L 45/143; H01L 45/144; H01L 45/146; H01L 49/00
See application file for complete search history.

(56) References Cited

U.S. PATENT DOCUMENTS

2016/0336378 A1*  11/2016  Ohba ................. G11C 13/003

* cited by examiner

*Primary Examiner* — Victor A Mandala
*Assistant Examiner* — Colleen E Snow
(74) *Attorney, Agent, or Firm* — Sheridan Ross P.C.

(57) ABSTRACT

A switch device according to an embodiment of the technology includes a first electrode, a second electrode that is disposed to face the first electrode, and a switch layer that is provided between the first electrode and the second electrode. The switch layer contains a chalcogen element. The switch layer includes a first region and a second region which have different composition ratios of one or more of chalcogen elements or different types of the one or more of chalcogen elements. The first region is provided close to the first electrode. The second region is provided closer to the second electrode than the first region.

20 Claims, 16 Drawing Sheets

SWITCH DEVICE AND STORAGE UNIT

CROSS REFERENCE TO RELATED APPLICATIONS

This application is a continuation of U.S. patent application Ser. No. 15/559,571, filed Sep. 19, 2017, which is a national stage application under 35 U.S.C. 371 and claims the benefit of PCT Application No. PCT/JP2016/058389 having an international filing date of Mar. 16, 2016, which designated the United States, which PCT application claimed the benefit of Japanese Patent Application No. 2015-073053 filed Mar. 31, 2015, the disclosures of which are incorporated herein by reference in their entirety.

TECHNICAL FIELD

The disclosure relates to a switch device including a chalcogenide layer between electrodes, and to a storage unit including the switch device.

BACKGROUND ART

In recent years, an increase in capacity has been demanded in a non-volatile memory for data storage. The non-volatile memory for data storage is typified by a resistive random access memory such as a resistance random access memory (ReRAM) and a phase-change random access memory (PRAM, registered trademark). However, the resistive random access memory using an existing access transistor results in an increased floor area per unit cell. Accordingly, as compared, for example, with a flash memory such as a NAND flash memory, it has not been easy to achieve the increase in capacity of a non-volatile memory even in a case where the non-volatile memory is miniaturized using the same design rules. In contrast, in a case where a so-called cross-point array structure is used, in which memory devices are provided at respective intersections (cross points) of intersecting wiring lines, a floor area per unit cell is reduced, thus making it possible to achieve the increase in capacity of the non-volatile memory.

A cross point memory cell is provided with a selecting device (a switch device) for cell selection, in addition to the memory device. Examples of the switch device may include a switch device (an ovonic threshold switch (OTS) device) using a chalcogenide material. In the OTS device, a leakage current is low in an OFF state; increasing a current in an ON state makes it possible to increase a selection ratio. Further, the OTS device exhibits switching characteristics, thus making it possible to obtain the selection ratio relatively easily even in a case where the OTS device is coupled in series to the memory device.

Note that a selector that includes a stacked body configured of a chalcogenide layer and an insulation layer is disclosed in PTL 1. In addition, a phase-change memory including a superlattice structure is disclosed in PTL 2. Further, a PRAM including a PN junction diode as a phase change diode is disclosed in PTL 3. Furthermore, a phase-change memory including an electrode that has a resistivity distribution is disclosed in PTL 4.

CITATION LIST

Patent Literature

PTL 1: Japanese Unexamined Patent Application Publication No. 2014-033041

PTL 2: Japanese Unexamined Patent Application Publication No. 2014-107528

PTL 3: Japanese Unexamined Patent Application Publication No. 2007-214565

PTL 4: International Publication No. WO2009/122569

SUMMARY OF INVENTION

Even when the resistive random access memory device is subjected to application of a voltage excessively larger than a threshold voltage on writing side, as a writing voltage, the memory device is unlikely to be broken. Therefore, the memory is erased by application of an erasing voltage even after the voltage excessively larger than the threshold voltage on writing side is applied as the writing voltage. However, when erasing is performed by application of the voltage, as the erasing voltage, larger than a threshold voltage on erasing side, with subsequent further application of the excessively larger voltage, and a voltage larger than a voltage causing a breakdown is applied to decrease the resistance again, the memory device is broken. When the memory device is broken by such excessive erasing, rewriting into the memory becomes difficult even by application of a set voltage It is therefore desirable to provide a switch device that makes it possible to suppress deterioration of a memory device due to excessive erasing and to perform a memory operation with higher reliability, and a storage unit including the switch device.

A switch device according to an embodiment of the disclosure includes: a first electrode; a second electrode that is disposed to face the first electrode; and a switch layer that is provided between the first electrode and the second electrode. The switch layer contains one or more of chalcogen elements selected from tellurium (Te), selenium (Se), and sulfur (S). The switch layer includes a first region and a second region which have different composition ratios of the one or more of chalcogen elements or different types of the one or more of chalcogen elements. The first region is provided close to the first electrode. The second region is provided closer to the second electrode than the first region.

A storage unit according to an embodiment of the disclosure includes a plurality of memory cells. Each of the memory cells includes a memory device and a switch device that is directly coupled to the memory device. The switch device included in each of the memory cells has the configuration identical to the configuration of the above-described switch device.

In the switch device according to the embodiment of the disclosure and in the storage unit according to the embodiment of the disclosure, the first region close to the first electrode in the switch layer and the second region close to the second electrode in the switch layer have different composition ratios of the one or more of chalcogen elements or different types of the one or more of chalcogen elements. This makes it possible to allow, for example, a threshold voltage on erasing side in the switch device to be larger than a threshold voltage on writing side in the switch device.

The switch device according to the embodiment of the disclosure and the storage unit according to the embodiment of the disclosure make it possible to allow the threshold voltage on erasing side in the switch device to be larger than the threshold voltage on writing side in the switch device, thus making it possible to suppress deterioration of the memory device due to excessive erasing, and to perform a memory operation with high reliability.

DESCRIPTION OF EMBODIMENTS

Some embodiments of the disclosure are described in detail below with reference to drawings. Note that description is given in the following order.

1. Embodiment

An example in which a switch layer is made of two layers

2. Modification Examples

Figure 1:
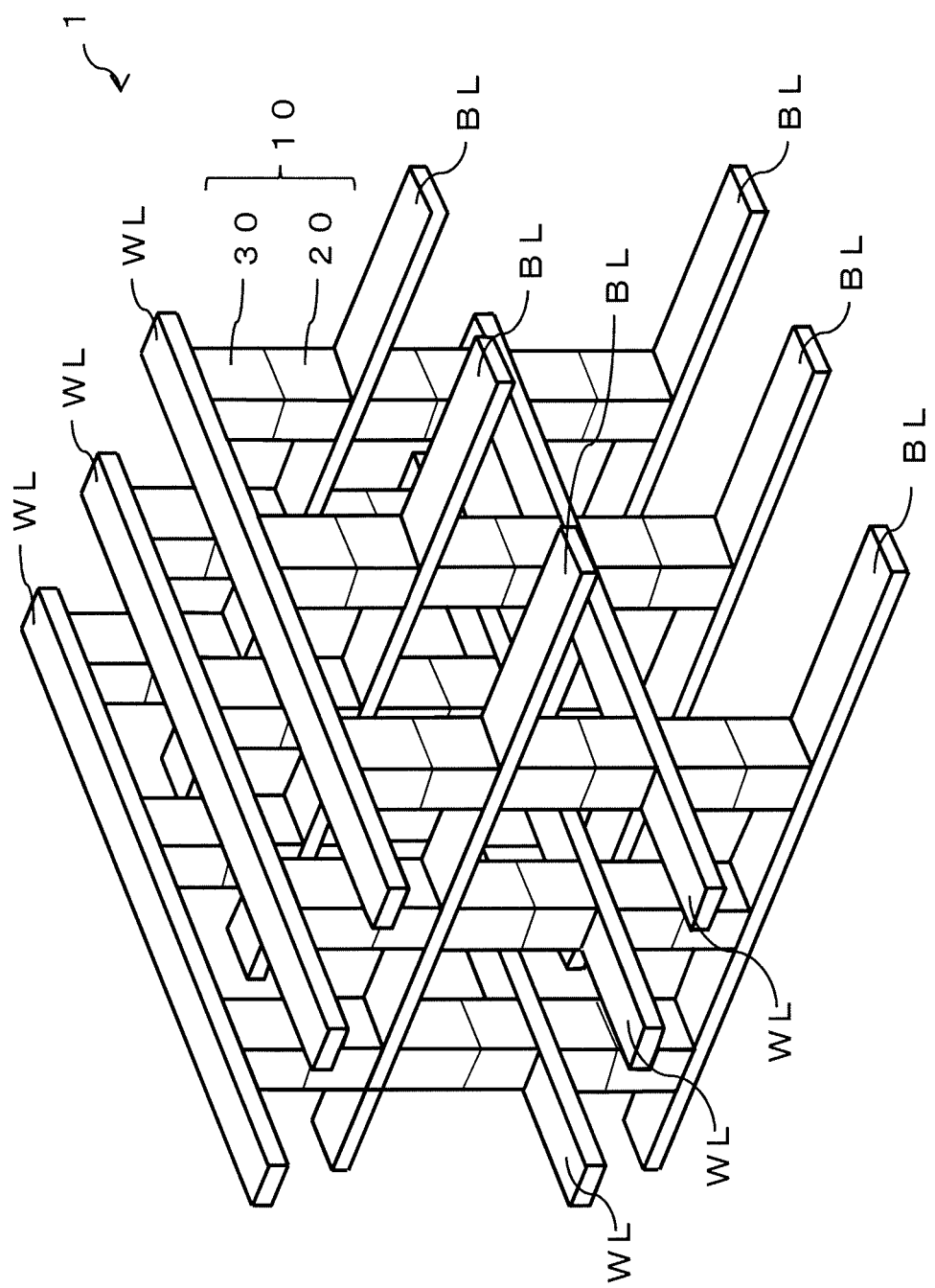
FIG. 1 illustrates an example of a perspective configuration of a memory cell array according to an embodiment of the disclosure.

Modification Example A: an example in which a diffusion suppressing layer is provided inside a switch layer Modification Example B: an example in which a switch layer is made of three or more layers Modification Example C: an example in which a composition ratio inside a switch layer has gradation in a stacking direction Modification Example D: a variation of a memory layer Modification Example E: a variation of a method of coupling a switch device to a memory device Modification Example F: an example in which bit lines or word lines extend in a stacking direction 3. Examples 1. Embodiment FIG. 1 illustrates a perspective configuration of a memory cell array 1 according to an embodiment of the disclosure. The memory cell array 1 corresponds to a specific but non-limiting example of a "storage unit" in one embodiment of the disclosure. The memory cell array 1 has a so-called cross point array structure, and includes memory cells 10. For example, as illustrated in FIG. 1, each of the memory cells 10 is provided at a position (a cross point) where each of word lines WL and each of bit lines BL face each other. In other words, the memory cell array 1 includes the plurality of word lines WL, the plurality of bit lines BL, and the plurality of memory cells 10 that are disposed at each cross point one by one. The memory cell 10 corresponds to a specific but non-limiting example of a "memory cell" in one embodiment of the disclosure. The word line WL and the bit line BL respectively correspond to specific but non-limiting examples of "first wiring" and "second wiring" in one embodiment of the disclosure.

The word lines WL extend in a common direction. The bit lines BL extend in a common direction that is different from the extending direction of the word lines WL (for example, in a direction orthogonal to the extending direction of the word lines WL). The plurality of word lines WL are disposed in one or a plurality of layers. For example, as illustrated in FIG. 1, the plurality of word lines WL are disposed separately in the plurality of hierarchical levels. The plurality of bit lines BL are disposed in one or a plurality of layers. For example, as illustrated in FIG. 1, the plurality of bit lines BL are disposed separately in the plurality of hierarchical levels.

In a case where the plurality of word lines WL are disposed separately in the plurality of hierarchical levels, the plurality of bit lines BL are disposed in a layer between a first layer in which the plurality of word lines WL are disposed and a second layer in which the plurality of word lines WL are disposed. The second layer is adjacent to the first layer. In a case where the plurality of bit lines BL are disposed separately in the plurality of hierarchical levels, the plurality of word lines WL are disposed in a layer between a third layer in which the plurality of bit lines BL are disposed and a fourth layer in which the plurality of bit lines BL are disposed. The fourth layer is adjacent to the third layer. In a case where the plurality of word lines WL are disposed separately in the plurality of hierarchical levels and the plurality of bit lines BL are disposed separately in the plurality of hierarchical levels as well, the plurality of word lines WL and the plurality of bit lines BL are alternately disposed in a stacking direction of the memory cell array 1.

[Memory Cell 10]

The memory cell array 1 includes the plurality of memory cells 10 that are two-dimensionally or three-dimensionally arranged on a substrate. The substrate includes, for example, a wiring line group that is electrically coupled to each of the word lines WL and each of the bit lines BL, and a circuit that couples the wiring line group to an external circuit. The memory cell 10 includes a memory device 30 and a switch device 20 that is directly coupled to the memory device 30. The switch device 20 corresponds to a specific but non-limiting example of a "switch device" in one embodiment of the disclosure. The memory device 30 corresponds to a specific but non-limiting example of a "memory device" in one embodiment of the disclosure.

For example, the memory device 30 is disposed close to the word line WL, and the switch device 20 is disposed close to the bit line BL. Note that the memory device 30 may be disposed close to the bit line BL, and the switch device 20 may be disposed close to the word line WL. In addition, in a case where the memory device 30 is disposed close to the word line WL and the switch device 20 is disposed close to the bit line BL in a certain layer, the memory device 30 may be disposed close to the bit line BL and the switch device 20 may be disposed close to the word line WL in a layer adjacent to the certain layer. Moreover, in each layer, the memory device 30 may be disposed on the switch device 20, or inversely, the switch device 20 may be disposed on the memory device 30.

Figure 2A:
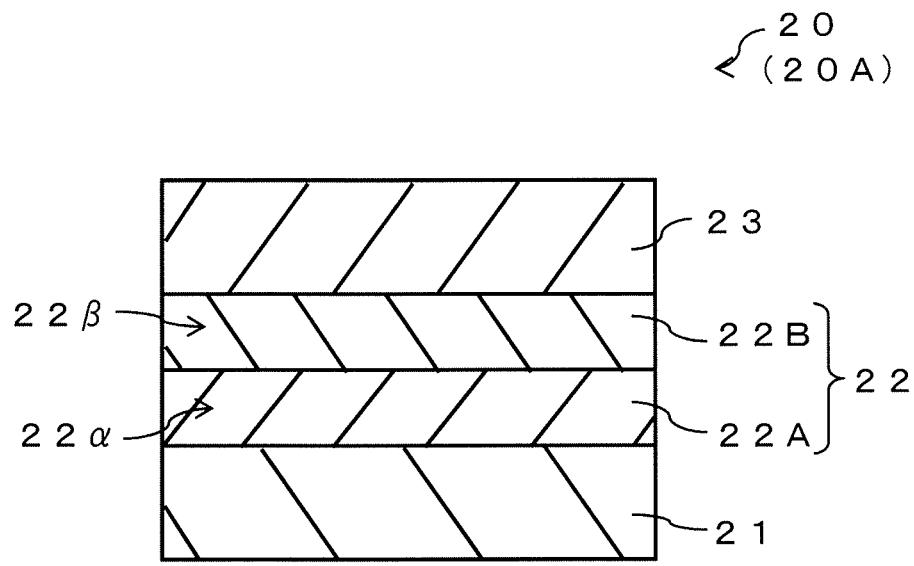
FIG. 2A illustrates an example of a cross-sectional configuration of a switch device of FIG. 1.
Figure 2B:
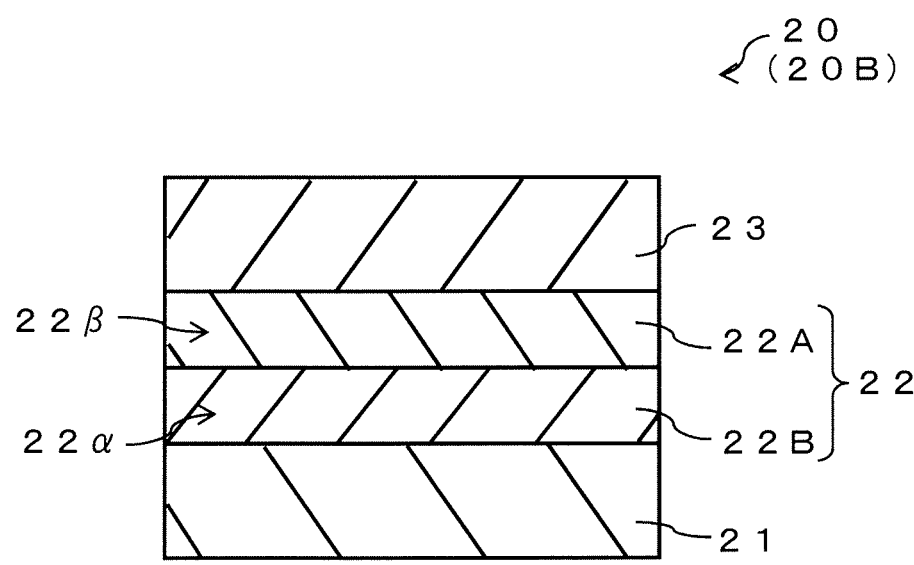
FIG. 2B illustrates an example of the cross-sectional configuration of the switch device of FIG. 1.
Figure 3A:
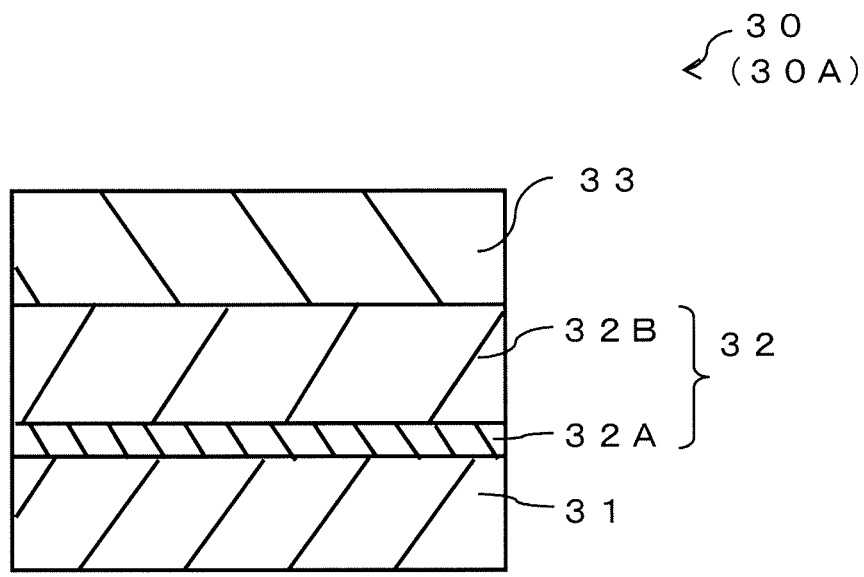
FIG. 3A illustrates an example of a cross-sectional configuration of a memory device of FIG. 1.
Figure 3B:
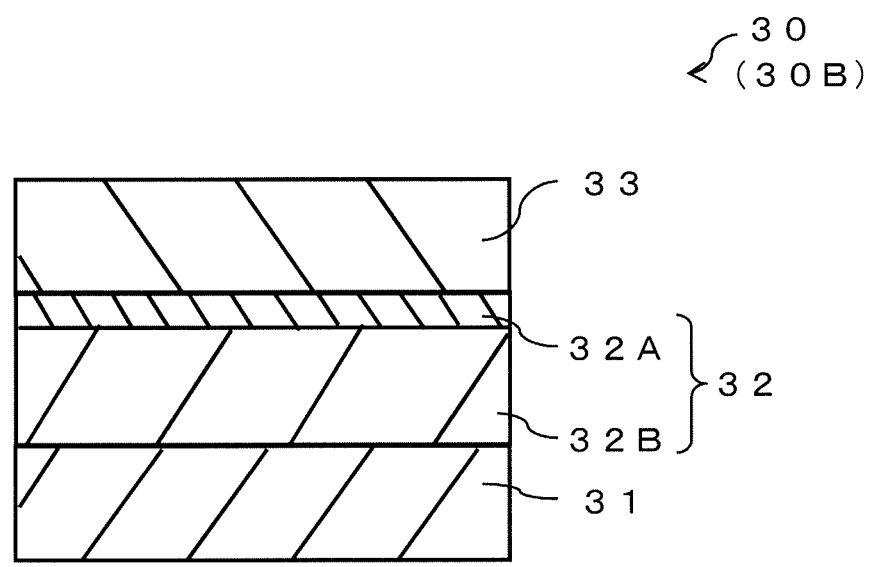
FIG. 3B illustrates an example of the cross-sectional configuration of the memory device of FIG. 1.

Next, the switch device 20 and the memory device 30 are described. FIG. 2A and FIG. 2B each illustrate an example of a cross-sectional configuration of the switch device 20. FIG. 3A and FIG. 3B each illustrate an example of a cross-sectional configuration of the memory device 30. FIG. 4 to FIG. 7 each illustrate an example of a cross-sectional configuration of the memory cell 10, and also each illustrate an example of a combination of the switch device 20 and the memory device 30.

[Switch Device 20]

The switch device 20 includes a first electrode 21, a second electrode 23, and a switch layer 22. The second electrode 23 is disposed to face the first electrode 21. The switch layer 22 is provided between the first electrode 21 and the second electrode 23. The first electrode 21 and the second electrode 23 respectively correspond to specific but non-limiting examples of "first electrode" and "second electrode" in one embodiment of the disclosure. As illustrated in FIG. 2A and FIG. 2B, the first electrode 21 may also serve as the bit line BL or the word line WL, or may be provided separately from the bit line BL and the word line WL. In a case where the first electrode 21 is provided separately from the bit line BL and the word line WL, the first electrode 21 is electrically coupled to the bit line BL or the word line WL. The second electrode 23 may also serve as an electrode of the memory device 30, or may be provided separately from the electrode of the memory device 30. In a case where the second electrode 23 is provided separately from the electrode of the memory device 30, the second electrode 23 is electrically coupled to the electrode of the memory device 30.

Each of the first electrode 21 and the second electrode 23 is made of, for example, a wiring material used for a semiconductor process. Each of the first electrode 21 and the second electrode 23 is made of, for example, tungsten (W), tungsten nitride (WN), titanium nitride (TiN), carbon (C), copper (Cu), aluminum (Al), molybdenum (Mo), tantalum (Ta), tantalum nitride (TaN), or silicide. In a case where the first electrode 21 or the second electrode 23 is made of a material that may possibly cause ion conduction by an electric field, such as Cu, a surface of the first electrode 21 or the second electrode 23 made of a material such as Cu may be coated with a barrier material that is less likely to cause the ion conduction and heat dissipation. Examples of the barrier material that is less likely to cause the ion conduction and heat dissipation may include tungsten (W), tungsten nitride (WN), titanium nitride (TiN), tantalum nitride (TaN), titanium tungsten (TiW), and titanium tungsten nitride (TiWN).

The second electrode 23 may be preferably made of a material that prevents diffusion of chalcogen elements contained in the switch layer 22 or an ion source layer 32B (described layer) due to application of the electric field. This is because, for example, the ion source layer 32B may contain, in some cases, transition metal elements as elements that perform a memory operation to retain a writing state. In such cases, switching characteristics may be possibly deteriorated when the transition metal elements are diffused into the switch layer 22 due to the application of the electric field. In addition, the first electrode 21 may be preferably made of a material that prevents the diffusion of the chalcogen elements contained in the switch layer 22 due to the application of the electric field.

This is because Te as one of the chalcogen elements that may be contained in the switch layer 22 is likely to be reacted or alloyed when coming into contact with an electrode material used in a typical semiconductor circuit, such as Al and Cu, and such a reaction significantly deteriorates the characteristics of the switch device 20. Accordingly, the first electrode 21 or the second electrode 23 or both may preferably contain a barrier material having a barrier property that prevents diffusion and ion conduction of the transition metal elements. Examples of the barrier material may include tungsten (W), tungsten nitride (WN), titanium nitride (TiN), carbon (C), tantalum (Ta), tantalum nitride (TaN), titanium tungsten (TiW), and titanium tungsten nitride (TiWN). Note that it is not necessary for the first electrode 21 or the second electrode 23 to be entirely made of the barrier material having the barrier property that prevents diffusion and ion conduction of the transition metal elements. For example, only a portion, of the first electrode 21 or the second electrode 23, coming into contact with the switch layer 22 may be made of the barrier material having the barrier property that prevents diffusion and ion conduction of the transition metal elements.

The switch layer 22 contains elements of group 16 in the periodic table, specifically, one or more of chalcogen elements selected from tellurium (Te), selenium (Se), and sulfur (S). In the switch device 20 having OTS phenomenon, the switch layer 22 may preferably maintain an amorphous structure without undergoing a phase change even when receiving application of the voltage bias for switching; the OTS phenomenon occurs more stably as the amorphous structure is more stable. The switch layer 22 may preferably further contain, in addition to the above-described chalcogen elements, one or more of incidental elements selected from boron (B), carbon (C), and silicon (Si). More preferably, the switch layer 22 may further contain nitrogen (N). The switch layer 22 may preferably contain a composition of one of BTe, CTe, BCTe, CSiTe, BSiTe, BCSiTe, BTeN, CTeN, BCTeN, CSiTeN, BSiTeN, and BCSiTeN.

When an element having a relatively small atomic radius is added to an element having a relatively large atomic radius, a difference between the atomic radiuses of the constituent elements becomes large, and thus the crystal structure is not easily formed. This allows the amorphous structure to be easily stabilized. Accordingly, in a case where an element having a relatively small atomic radius such as boron (B) is added into the layer containing the chalcogen element having a relatively large atomic radius such as Te as with the switch layer 22, a plurality of elements having different atomic radiuses are present inside the layer, which stabilizes the amorphous structure.

Boron (B) has particularly low electric conductivity even as a single substance among semimetals. Therefore, boron (B) contained in the switch layer 22 increases a resistance value of the switch layer 22. In addition, boron (B) has a smaller atomic radius than the chalcogen elements. Therefore, boron (B) contained in the switch layer 22 stabilizes the amorphous structure of the switch layer 22 and stably expresses the OTS phenomenon.

Carbon (C) makes it possible to increase resistance of the switch layer 22 in the structure other than the structure including sp2 orbital that is observed in graphite, for example. In addition, carbon (C) has a smaller ionic radius than the chalcogen elements, which stabilizes the amorphous structure of the switch layer 22 and stably expresses the OTS phenomenon.

Nitrogen (N) is combined with one of boron (B), carbon (C), and silicon (Si). Therefore, nitrogen (N) and one of boron (B), carbon (C), and silicon (Si) are contained in the switch layer 22, thus increasing the resistance value of the switch layer 22. For example, a bandgap of a-BN that is the bond of nitrogen (N) and boron (B) is 5.05 even in the amorphous state. As mentioned above, in the case where nitrogen (N) is contained in the switch layer 22, the resistance value of the switch layer 22 is larger than that in the case where nitrogen (N) is not contained in the switch layer 22. This suppresses leakage current. In addition, a bound substance of nitrogen (N) and one of boron (B), carbon (C), and silicon (Si) dispersed into the switch layer 22 allows the amorphous structure to be stabilized.

The switch layer 22 is changed into a low-resistance state when the applied voltage is increased to a predetermined threshold voltage (a switching threshold voltage) or higher, and is changed into a high-resistance state when the applied voltage is decreased to a voltage lower than the above-described threshold voltage (the switching threshold voltage), without undergoing a phase change between the amorphous phase and the crystal phase. In other words, the switch layer 22 does not undergo the phase change due to application of a voltage pulse or a current pulse from an unillustrated power supply circuit (a pulse application section) through the first electrode 21 and the second electrode 23. Moreover, the switch layer 22 does not perform a memory operation such as retention of a conduction path formed by ion movement in response to the voltage application even after the applied voltage is removed.

The switch layer 22 functions as a bidirectional switch. When a first voltage that allows the voltage of the first electrode 21 to be higher than the voltage of the second electrode 23 is applied between the first electrode 21 and the second electrode 23, the switch layer 22 is changed into the low-resistance state due to increase in an absolute value of the first voltage to a first threshold voltage or higher, and the switch layer 22 is changed into the high-resistance state due to decrease in the absolute value of the first voltage to a voltage lower than the first threshold voltage. Further, when a second voltage that allows the voltage of the second electrode 23 to be higher than the voltage of the first electrode 21 is applied between the first electrode 21 and the second electrode 23, the switch layer 22 is changed into the low-resistance state due to increase in an absolute value of the second voltage to a second threshold voltage or higher, and the switch layer 22 is changed into the high-resistance state due to decrease in the absolute value of the second voltage to a voltage lower than the second threshold voltage.

When a writing voltage Vw that decreases the resistance of the memory cell 10 is applied to the memory cell 10, the switch layer 22 is changed into the low-resistance state due to increase in an absolute value of the third voltage between the first electrode 21 and the second electrode 23 to a third threshold voltage or higher, and the switch layer 22 is changed into the high-resistance state due to decrease in the absolute value of the third voltage to a voltage lower than the third threshold voltage. When an erasing voltage Vr that increases the resistance of the memory cell 10 is applied to the memory cell 10, the switch layer 20 is changed into the low-resistance state due to increase in an absolute value of a fourth voltage between the first electrode 21 and the second electrode 23 to a fourth threshold voltage or higher, and the switch layer 20 is changed into the high-resistance state due to decrease in the absolute value of the fourth voltage to a voltage lower than the fourth threshold voltage.

In the switch layer 22, IV characteristics at the time when data is written into the memory cell 10 (hereinafter, referred to as "at the writing") and IV characteristics at the time when data written into the memory cell 10 is erased (hereinafter, referred to as "at the erasing") are different from each other. Specifically, in the switch layer 22, an absolute value of a threshold voltage Vth1 (the third threshold voltage) at the writing and an absolute value of a threshold voltage Vth2 (the fourth threshold voltage) at the erasing are different from each other. In other words, the switch layer 22 has asymmetry property in which the IV characteristics (specifically, the threshold voltages) are different between at the writing and at the erasing.

In the switch layer 22, composition ratios of the one or more of chalcogen elements or the types of the one or more of chalcogen elements are different between a first region 22α close to the first electrode 21 and a second region 22β closer to the second electrode 23 than the first region 22α. In the switch layer 22, further, composition ratios of the above-described one or more of incidental elements or the types of the above-described one or more of incidental elements are different between the first region 22α and the second region 22β.

In the switch layer 22, the composition ratios of the one or more of chalcogen elements or the types of the one or more of chalcogen elements and the other component elements are different between the first region 22α and the second region 22β such that the absolute value of the first threshold voltage and the absolute value of the second threshold voltage are different from each other. Specifically, in the switch layer 22, the composition ratios of the one or more of chalcogen elements or the types of the one or more of chalcogen elements and the other component elements are different between the first region 22α and the second region 22β such that the absolute value of the threshold voltage Vth1 (the third threshold voltage) at the writing and the absolute value of the threshold voltage Vth2 (the fourth threshold voltage) at the erasing are different from each other. More specifically, in the switch layer 22, the composition ratios of the one or more of chalcogen elements or the types of the one or more of chalcogen elements and the other component elements are different between the first region 22α and the second region 22β such that the absolute value of the threshold voltage Vth2 (the fourth threshold voltage) at the erasing becomes larger than the absolute value of the threshold voltage Vth1 (the third threshold voltage) at the writing.

Figure 4:
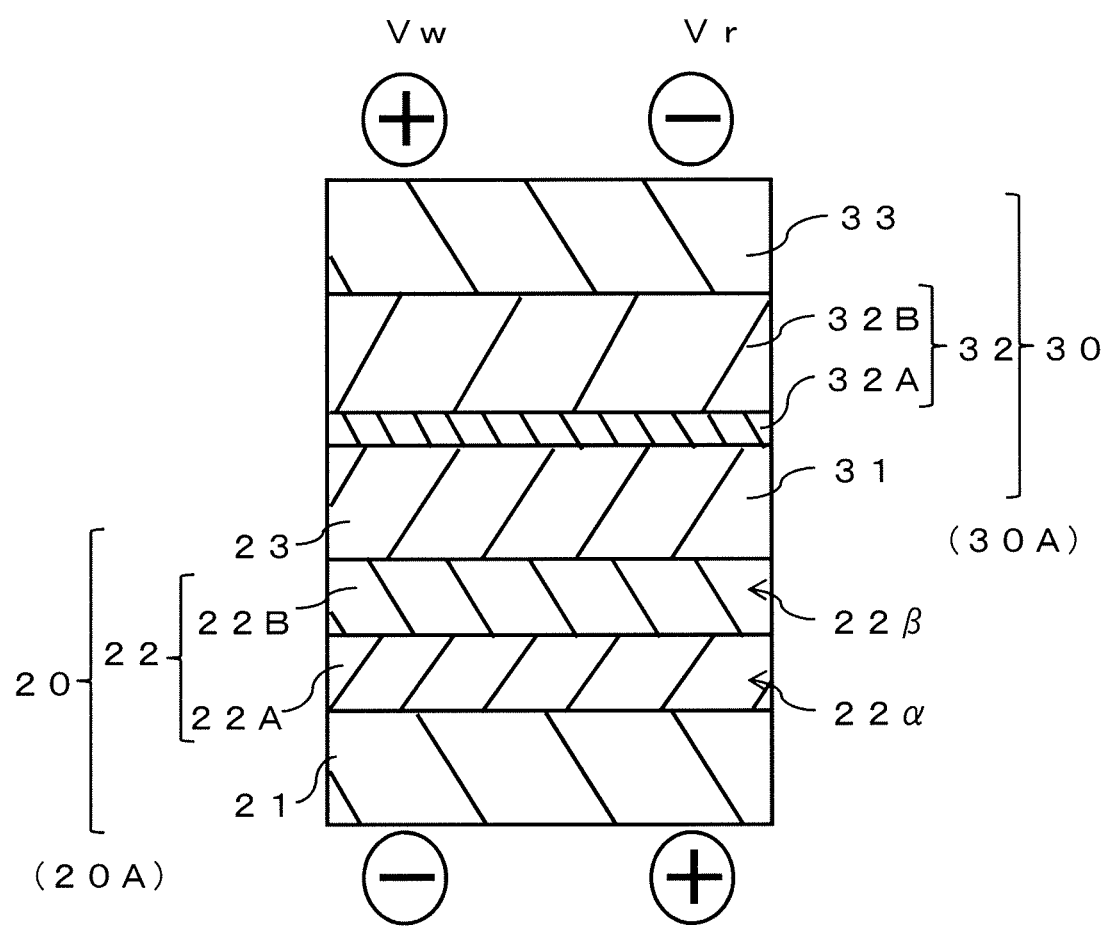
FIG. 4 illustrates an example of a cross-sectional configuration of a memory cell of FIG. 1.
Figure 6:
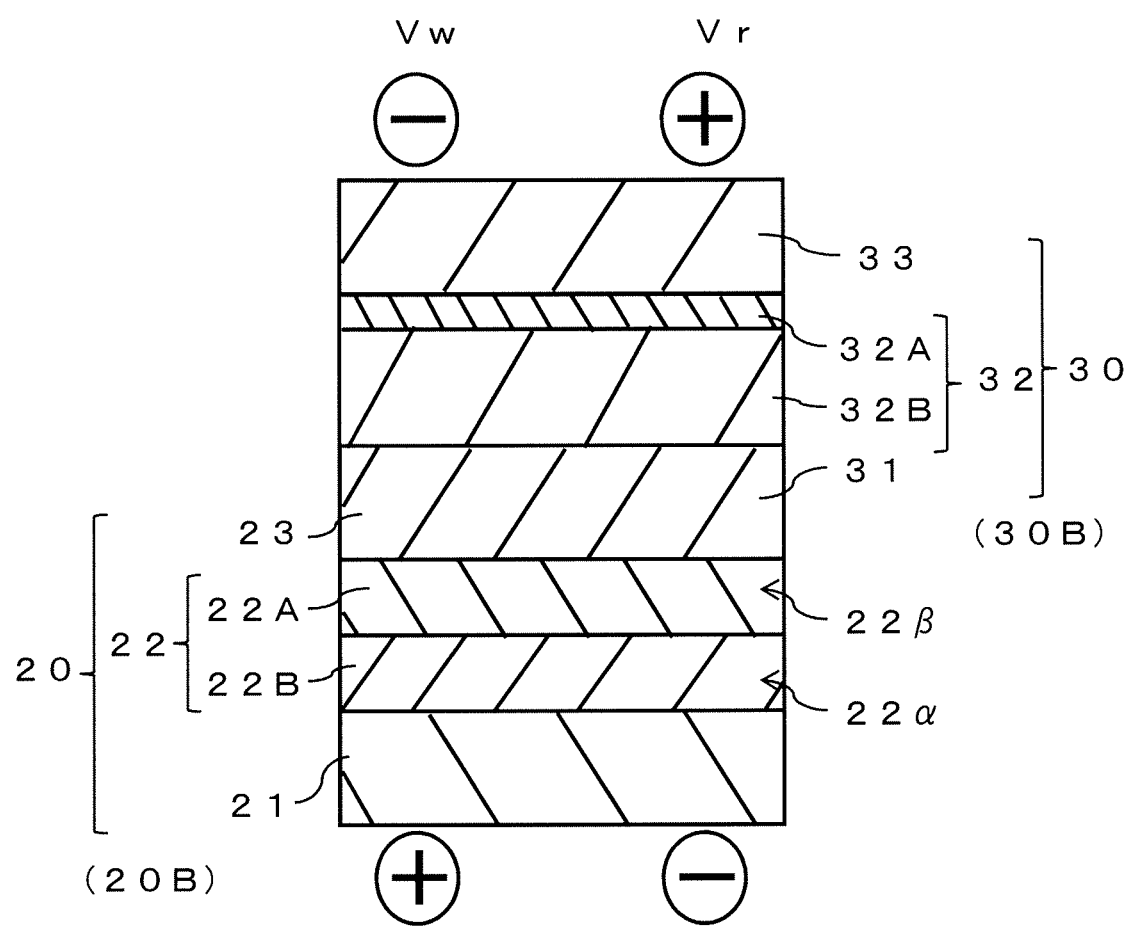
FIG. 6 illustrates an example of the cross-sectional configuration of the memory cell of FIG. 1.
Figure 7:
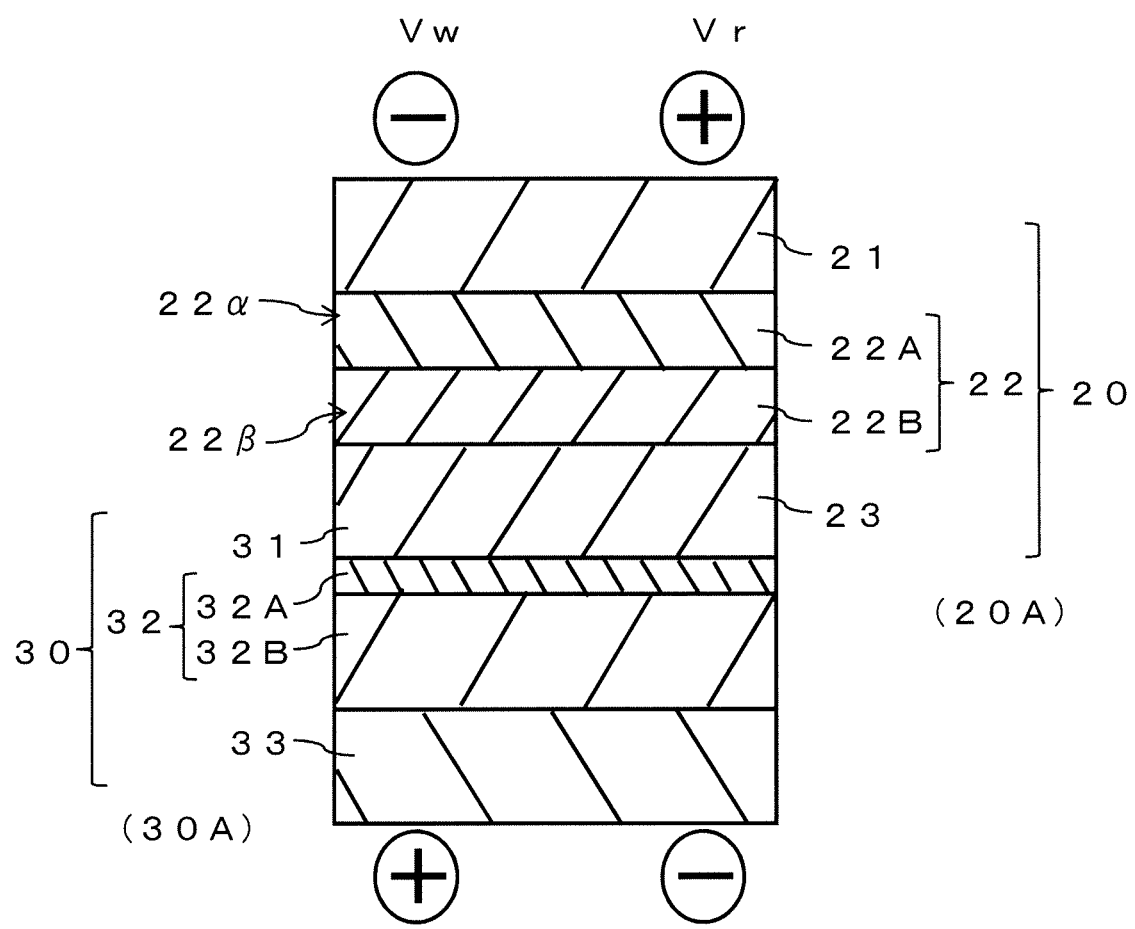
FIG. 7 illustrates an example of the cross-sectional configuration of the memory cell of FIG. 1.

In a case where the resistance-change layer 32A is provided at a position closer to the switch device 20 than the ion source layer 32B, the region in which the composition ratios of the one or more of chalcogen elements are relatively small (the first region 22α), out of the first region 22α and the second region 22β, is disposed at a position distant from the memory device 30 (see FIG. 4 and FIG. 7). In addition, in a case where the resistance-change layer 32A is provided at a position distant from the switch device 20 than the ion source layer 32B, the region in which the composition ratios of the one or more of chalcogen elements are relatively small (the second region 22β), out of the first region 22α and the second region 22β, is disposed at a position close to the memory device 30 (see FIG. 5 and FIG. 6).

Assume that the first region 22α is a region close to the electrode having higher potential at the erasing, out of the first electrode 21 and the second electrode 23 (see FIG. 4 and FIG. 7). At this time, the composition ratios of one or more of chalcogen elements selected from tellurium (Te), selenium (Se), and sulfur (S) are relatively small in the first region 22α and are relatively large in the second region 22β. Further, the composition ratios of one or more of incidental elements selected from boron (B), carbon (C), and silicon (Si) are relatively large in the first region 22α and are relatively small in the second region 22β. Assume that the switch layer 22 contains, for example, tellurium (Te) and boron (B). At this time, the composition ratio of tellurium (Te) is relatively small in the first region 22α and is relatively large in the second region 22β, and the composition ratio of boron (B) is relatively large in the first region 22α and is relatively small in the second region 22β.

Figure 5:
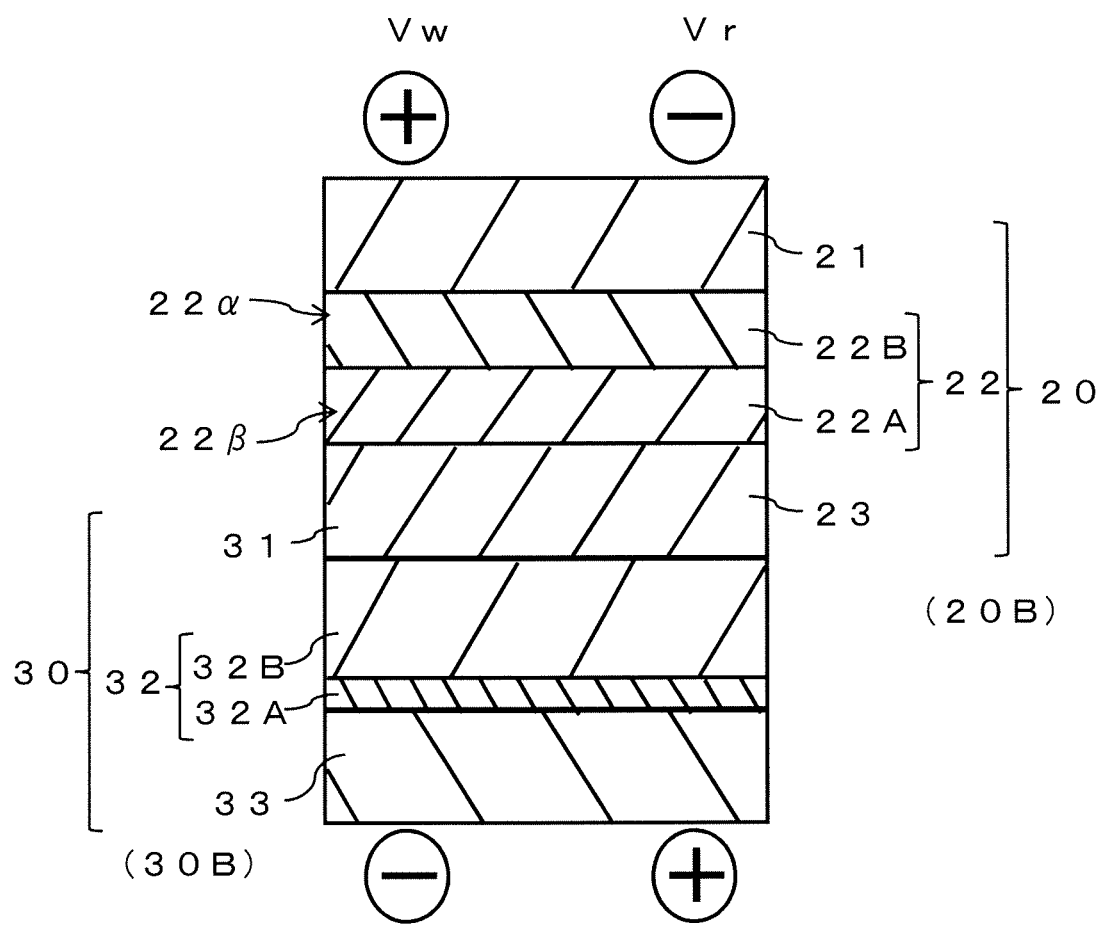
FIG. 5 illustrates an example of the cross-sectional configuration of the memory cell of FIG. 1.

Assume that the second region 22β is a region close to the electrode having higher potential at the erasing, out of the first electrode 21 and the second electrode 23 (see FIG. 5 and FIG. 6). At this time, the composition ratios of one or more of chalcogen elements selected from tellurium (Te), selenium (Se), and sulfur (S) are relatively small in the second region 22β and are relatively large in the first region 22α. Further, the composition ratios of one or more of incidental elements selected from boron (B), carbon (C), and silicon (Si) are relatively large in the second region 22β and are relatively small in the first region 22α. Assume that the switch layer 22 contains, for example, tellurium (Te) and boron (B). At this time, the composition ratio of tellurium (Te) is relatively small in the second region 22β and is relatively large in the first region 22α, and the composition ratio of boron (B) is relatively large in the second region 22β and is relatively small in the first region 22α.

For example, as illustrated in FIG. 2A and FIG. 2B, the switch layer 22 includes two stacked layers (a first layer 22A and a second layer 22B). The composition ratios of the one or more of chalcogen elements or the types of the one or more of chalcogen elements are different between the first layer 22A and the second layer 22B. Further, the composition ratios of the above-described one or more of incidental elements or the types of the above-described one or more of incidental elements are different between the first layer 22A and the second layer 22B.

The composition ratios of the one or more of chalcogen elements or the types of the one or more of chalcogen elements are different between the first layer 22A and the second layer 22B such that the absolute value of the first threshold voltage and the absolute value of the second threshold voltage are different from each other. Specifically, the composition ratios of the one or more of chalcogen elements or the types of the one or more of chalcogen elements are different between the first layer 22A and the second layer 22B such that the absolute value of the threshold voltage Vth1 (the third threshold voltage) at the writing and the absolute value of the threshold voltage Vth2 (the fourth threshold voltage) at the erasing are different from each other. More specifically, the composition ratios of the one or more of chalcogen elements or the types of the one or more of chalcogen elements are different between the first layer 22A and the second layer 22B such that the absolute value of the threshold voltage Vth2 (the fourth threshold voltage) at the erasing becomes larger than the absolute value of the threshold voltage Vth1 (the third threshold voltage) at the writing.

In the case where the resistance-change layer 32A is provided at a position closer to the switch device 20 than the ion source layer 32B, the layer in which the composition ratios of the one or more of chalcogen elements are relatively small (the first layer 22A), out of the first layer 22A and the second layer 22B, is disposed at a position distant from the memory device 30 (see FIG. 4 and FIG. 7). In addition, in the case where the resistance-change layer 32A is provided at a position distant from the switch device 20 than the ion source layer 32B, the layer in which the composition ratios of the one or more of chalcogen elements are relatively small (the first layer 22A), out of the first layer 22A and the second layer 22B, is disposed at a position close to the memory device 30 (see FIG. 5 and FIG. 6). At this time, the first layer 22A is provided close to the electrode having higher potential at the erasing, out of the first electrode 21 and the second electrode 23, and the second layer 22B is provided close to the electrode having lower potential at the erasing, out of the first electrode 21 and the second electrode 23 (see FIG. 4 to FIG. 7). The composition ratios of one or more of chalcogen elements selected from tellurium (Te), selenium (Se), and sulfur (S) are relatively small in the first layer 22A and are relatively large in the second layer 22B. Further the composition ratios of one or more of incidental elements selected from boron (B), carbon (C), and silicon (Si) are relatively large in the first layer 22A and are relatively small in the second layer 22B. Assume that each of the first layer 22A and the second layer 22B contains, for example, tellurium (Te) and boron (B). At this time, the composition ratio of tellurium (Te) is relatively small in the first layer 22A and is relatively large in the second layer 22B, and the composition ratio of boron (B) is relatively large in the first layer 22A and is relatively small in the second layer 22B.

[Memory Device 30]

The memory device 30 includes a third electrode 31, a fourth electrode 33, and a memory layer 32. The fourth electrode 33 is disposed to face the third electrode 31. The memory layer 32 is provided between the third electrode 31 and the fourth electrode 33. The memory device is a bidirectional resistive random access memory. The memory layer 32 has a stacked structure in which the resistance-change layer 32A and the ion source layer 32B are stacked.

The ion source layer 32B contains mobile elements that form a transmission path inside the resistance-change layer 32A in response to application of the electric field. Examples of the mobile elements may include transition metal elements, aluminum (Al), copper (Cu), and chalcogen elements. Examples of the chalcogen elements may include tellurium (Te), selenium (Se), and sulfur (S). Examples of the transition metal elements may include elements of groups 4 to 6 in the periodic table, such as titanium (Ti), zirconium (Zr), hafnium (Hf), vanadium (V), niobium (Nb), tantalum (Ta), chromium (Cr), molybdenum (Mo), and tungsten (W). The ion source layer 32B contains one or two or more of the above-described mobile elements. In addition, the ion source layer 32B may contain oxygen (O), nitrogen (N), elements other than the above-described mobile elements (such as manganese (Mn), cobalt (Co), iron (Fe), nickel (Ni), and platinum (Pt)), silicon (Si), or other element.

The resistance-change layer 32A is made of, for example, an oxide of a metal element or a non-metal element, or a nitride of a metal element or a non-metal element. In a case where a predetermined voltage is applied between the third electrode 31 and the fourth electrode 33, a resistance value of the resistance-change layer 32A is varied. The resistance-change layer 32A is an oxide layer containing, for example, aluminum (Al). For example, when the voltage is applied between the third electrode 31 and the fourth electrode 33, the transition metal elements contained in the ion source layer 32B move into the resistance-change layer 32A to form the transmission path, which decreases the resistance of the resistance-change layer 32A. In addition, a structural defect such as an oxygen defect and a nitrogen defect occurs inside the resistance-change layer 32A to form the transmission path, which decreases the resistance of the resistance-change layer 32A. Further, when a voltage is applied in a direction opposite to the direction of the voltage that is applied at a time when the resistance of the resistance-change layer 32A is decreased, the transmission path is disconnected or electric conductivity is changed, thereby increasing the resistance of the resistance-change layer 32A.

Note that all of the metal element and the non-metal element contained in the resistance-change layer 32A are not necessarily in the oxide state, and may be partially oxidized. In addition, it is sufficient for an initial resistance value of the resistance-change layer 32A to achieve the device resistance of, for example, about several MΩ to about several hundreds of GΩ. The film thickness of the resistance-change layer 32A may be preferably, for example, about 1 nm to about 10 nm although the optimal value thereof is varied depending on the size of the device and the resistance value of the ion source layer 32B.

The third electrode 31 may also function as the electrode of the switch device 20 as illustrated in FIG. 4 to FIG. 7, or may be provided separately from the electrode of the switch device 20. The fourth electrode 33 may also function as the word line WL or the bit line BL, or may be provided separately from the word line WL and the bit line BL. In a case where the fourth electrode 33 is provided separately from the word line WL and the bit line BL, the fourth electrode 33 is electrically coupled to the word line WL or the bit line BL.

Next, operation of the memory cell array 1 according to the present embodiment is described with reference to comparative examples.

Figure 8:
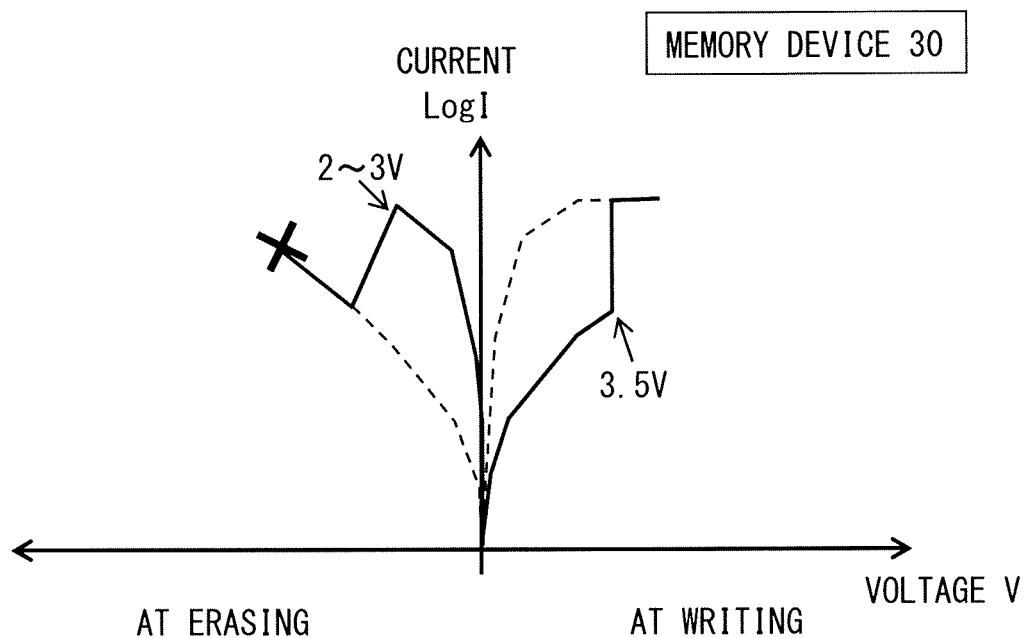
FIG. 8 illustrates an example of IV characteristics of the memory device of FIG. 1.
Figure 9:
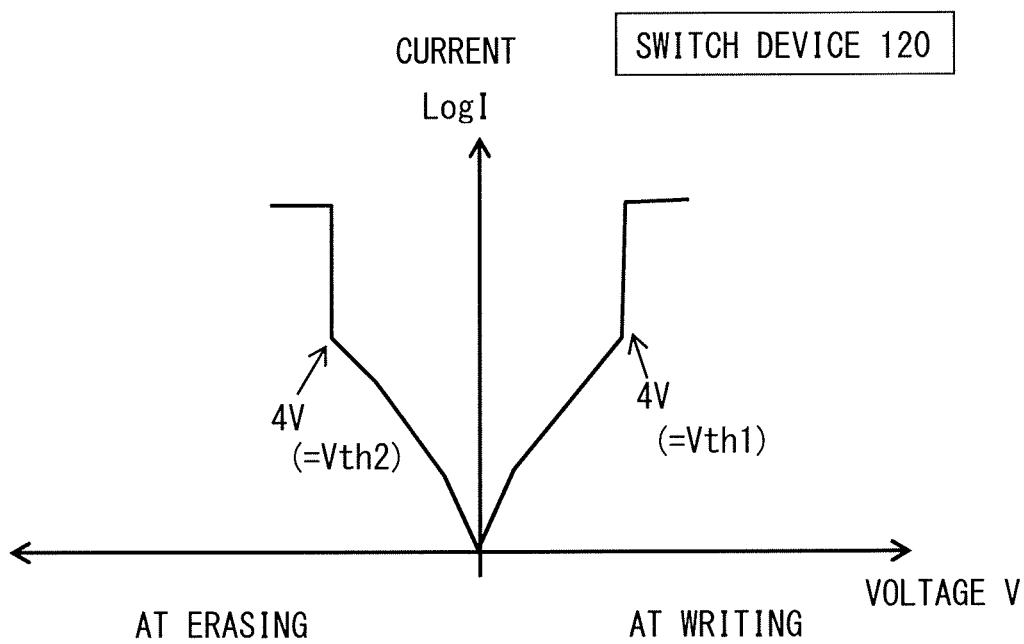
FIG. 9 illustrates an example of IV characteristics of a switch device according to a comparative example.
Figure 10:
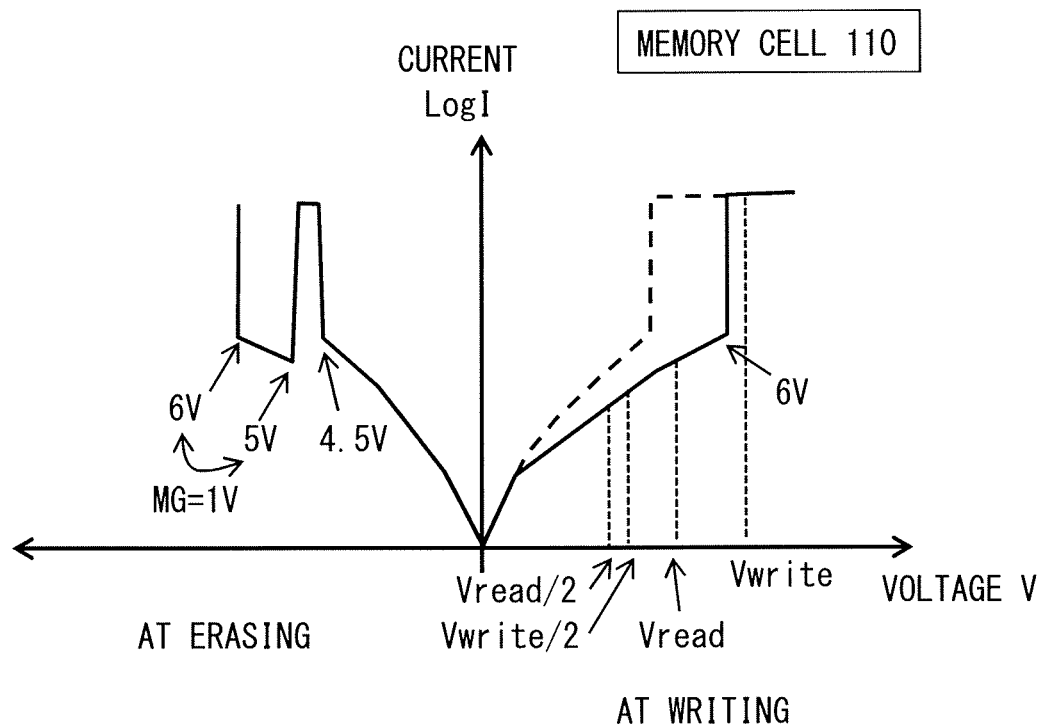
FIG. 10 illustrates an example of IV characteristics of a memory cell according to the comparative example.
Figure 11:
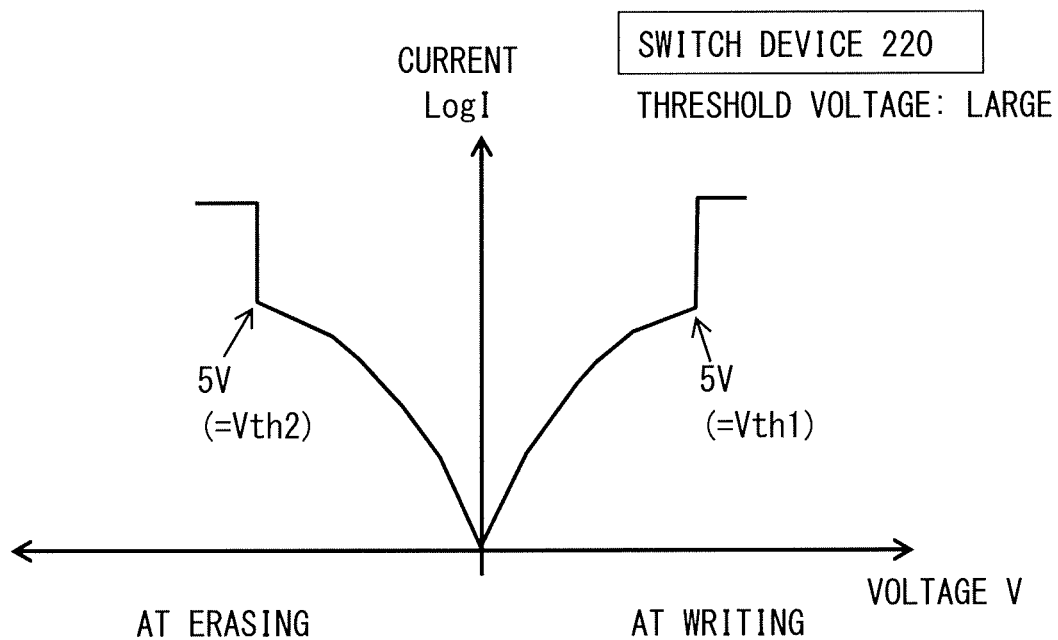
FIG. 11 illustrates an example of IV characteristics of a switch device according to a comparative example.
Figure 12:
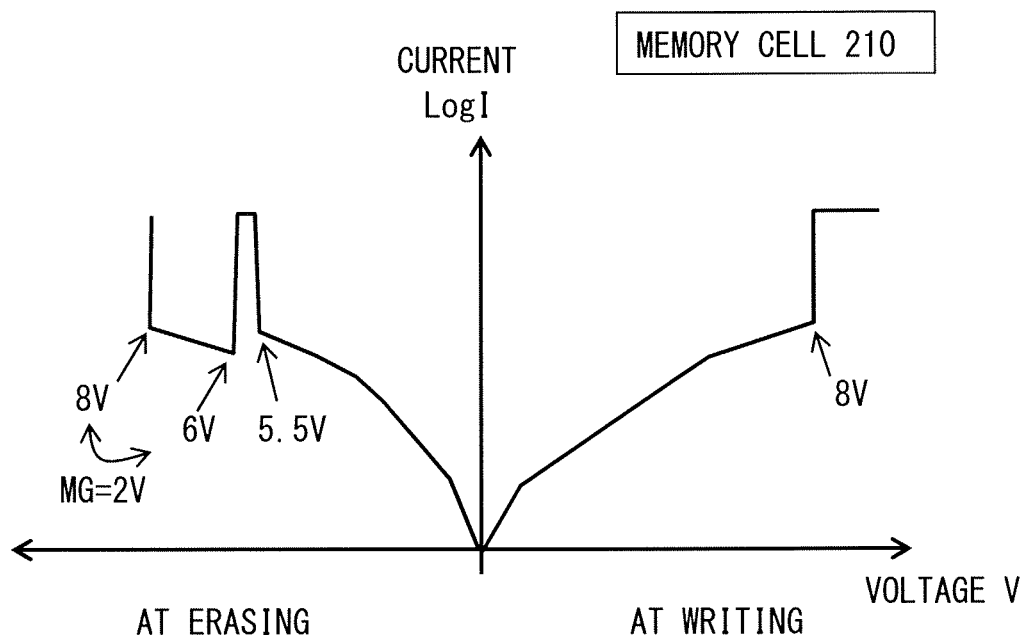
FIG. 12 illustrates an example of IV characteristics of a memory cell according to a comparative example.
Figure 13:
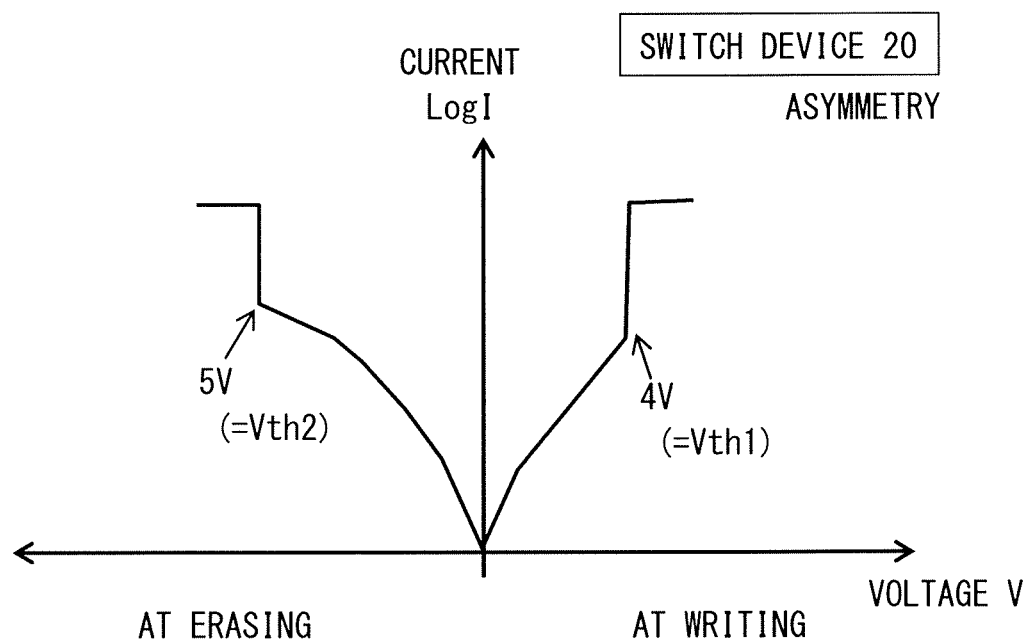
FIG. 13 illustrates an example of IV characteristics of the switch device of FIG. 1.
Figure 14:
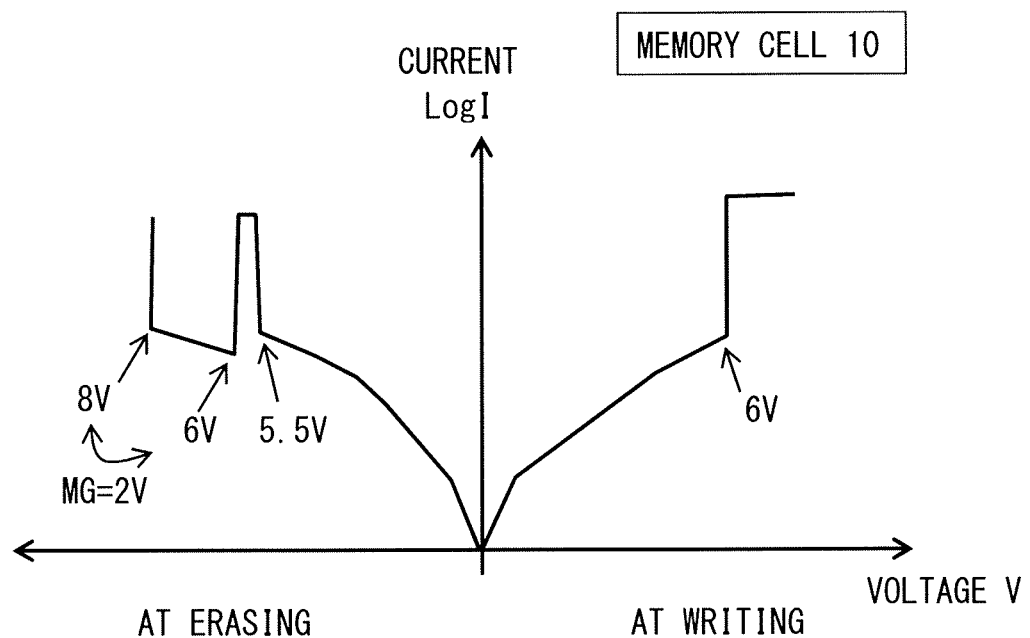
FIG. 14 illustrates an example of IV characteristics of the memory cell of FIG. 1.

FIG. 8 illustrates an example of a relationship between the voltage and the current both applied to the memory device 30. FIG. 9 illustrates an example of a relationship between a voltage and a current both applied to a switch device 120 according to the comparative example. FIG. 10 illustrates an example of a relationship between a voltage and a current both applied to a memory cell 110 that includes the memory device 30 of FIG. 8 and the switch device 120 of FIG. 9. FIG. 11 illustrates an example of a relationship between a voltage and a current both applied to a switch device 220 according to a comparative example. FIG. 12 illustrates an example of a relationship between a voltage and a current both applied to a memory cell 210 that includes the memory device 30 of FIG. 8 and the switch device 220 of FIG. 11. FIG. 13 illustrates an example of a relationship between a voltage and a current both applied to the switch device 20. FIG. 14 illustrates an example of a relationship between the voltage and the current both applied to the memory cell 10 that includes the memory device 30 of FIG. 8 and the switch device 20 of FIG. 13. Note that the voltage and the current value of each of the switch device 20, the memory device 30, and the memory cell 10 in the embodiments of the disclosure are not limited to those described as examples.

As appreciated from FIG. 8, in the memory device 30, the current value is increased as a forward bias (the writing voltage) is increased; the writing operation due to the formation of the transmission path in the resistance-change layer 32A is performed at a predetermined writing voltage (for example, about 3.5 V); and the memory layer 32 is changed into the low-resistance state to increase the current. In other words, the memory device 30 is changed into the low-resistance state in response to application of the writing voltage, and the low-resistance state is maintained even after the application of the voltage is stopped.

When the writing voltage is applied to the switch device 120, the current is increased in the switch device 120 along with the increase in the writing voltage. When the writing voltage exceeds the predetermined threshold Vth1 (for example, about 4 V), the current is drastically increased or the resistance is decreased due to the OTS operation, which brings the switch device 120 into an ON state. Thereafter, when the writing voltage is decreased, the value of the current flowing through the electrode of the switch device 120 is gradually decreased. For example, depending on the material and the formation condition of the switch device 120, the resistance is drastically increased, thus bringing the switch device 120 into an OFF state at the threshold voltage substantially equal to that at the increasing.

The switching behavior of the current value at the time of starting and stopping the application of the writing voltage of the memory cell 110 is represented by IV curve that is a combination of the IV curve of the switch device 120 of FIG. 9 and the IV curve of the memory device 30 of FIG. 8 (see FIG. 10). In such a memory cell 110, for example, in a V/2 bias system, a reading voltage (Vread) of the memory cell 110 is set to a voltage larger than the threshold at which the resistance is drastically varied on the IV curve, and Vread/2 is set to a voltage smaller than the threshold at which the resistance is varied. This increases a selection ratio (an ON/OFF ratio) defined by the current ratio of the Vread bias to the Vread/2 bias. In addition, the IV curve of the memory cell 110 is the combination of the IV curve of the switch device 120 and the IV curve of the memory device 30 as described above, and thus the selection ratio (the ON/OFF ratio) becomes larger as the resistance variation (or the current variation) around the threshold of the switch device 120 is larger. Moreover, the IV curve of the memory cell 110 is the combination of the IV curve of the switch device 120 and the IV curve of the memory device 30 as described above, and thus the selection ratio (the ON/OFF ratio) becomes larger as the resistance variation (or the current variation) around the threshold of the switch device 120 is larger. Further, the reading margin becomes larger as the selection ratio is larger, thus making it possible to increase a cross point array size without erroneous reading and to further increase the capacity of the memory cell array.

The same applies to the writing operation, in addition to the reading operation. In the cross point array, a large number of bits are coupled to the bit line BL or the word line WL that is same as that of the objective memory cell 110. Therefore, as illustrated in FIG. 10, when a leakage current biased to Vwrite/2 in the non-selected state that is illustrated by an intersection of Vwrite/2 and an IV loop of the dashed line of the IV curve in a Set state is large, erroneous writing may possibly occur in the non-selected memory cell 110.

Therefore, in the writing operation, the leakage current may be preferably suppressed to such an extent that erroneous writing of the non-selected memory cell 110 biased to Vwrite/2 does not occur, while the writing voltage Vwrite is set to a voltage (for example, a voltage larger than about 6 V) that provides the current necessary for writing into the memory device 30. In other words, as the leakage current biased to Vwrite/2 in the non-selected state is smaller, it is possible to operate a larger-sized cross point array without erroneous writing. Accordingly, increasing the ON/OFF ratio of the switch device also during the writing operation leads to a large capacity of the memory cell array.

On the other hand, when a reverse bias (the erasing voltage in this case) is applied, the variation in the current value of the switch device 120 during application of the erasing voltage exhibits behavior similar to that during the application of the writing voltage (the IV curve of FIG. 9). In contrast, the current value of the memory device 30 during application of the erasing voltage is changed from the low-resistance state to the high-resistance state by the application of the voltage equal to or higher than the erasing threshold voltage (for example, about 2 V to about 3 V) (the IV curve of FIG. 8). Further, the variation in the current value of the memory cell 110 during the application of the erasing voltage is represented by a combination of the IV curve of the switch device 120 and the IV curve of the memory device 30, as with the case during the application of the writing voltage (the IV curve of FIG. 10).

Incidentally, in a case where the large erasing voltage is further applied after the erasing operation is performed as a result of occurrence of transition of the memory device 30 from the low-resistance state to the high-resistance state, when the current equal to or higher than the threshold current of the switch device 120 flows through the memory cell 110 in the high-resistance state, the switch device 120 is again switched and makes a transition from the high-resistance state to the low-resistance state. At this time, the voltage divided corresponding to the retention voltage is applied to the switch device 120, and the remaining voltage is applied to the memory device 30. The re-switching causes an excessive voltage to be applied to the memory device 30. Under conditions that the IV characteristics of the switch device 120 is symmetrical in a positive-negative direction; the resistance value of the memory device 30 in the high-resistance state is symmetrical in the positive-negative direction; and the threshold current at which the resistance of the memory device 30 is varied is sufficiently large, for example, the switching voltage in the positive direction becomes theoretically equal to the re-switching voltage in the negative direction. This causes re-switching after the erasing operation when the erasing voltage is about 6V, as illustrated in FIG. 10. At this time, in a case where a reverse withstand voltage of the memory device 30 is smaller than a voltage value that is obtained by subtracting the retention voltage from the re-switching voltage, the memory device 30 is destroyed because the excessive voltage is applied to the memory device 30. In addition, as illustrated in FIG. 10, the voltage at which the erasing is completed is about 5 V, and the voltage at which the re-switching occurs is about 6 V; thus, a margin MG therebetween is 1 V that is small. The voltage at which the erasing of the memory device 30 is completed is easily varied typically. Therefore, when the margin MG is not sufficiently large, setting of the voltage that completely erases the memory device 30 to increase the resistance thereof becomes difficult, which makes it difficult to perform stable repetitive operation of writing and erasing.

Next, the switch device 220 of FIG. 11 is described. The threshold voltage and the threshold current of switch device 220 of FIG. 11 are larger than those of the switch device 120 of FIG. 9. Because the threshold voltage and the threshold current of the switch device 220 are large, the threshold voltage of the memory cell 210 becomes about 8 V when the writing voltage is applied (see FIG. 12). When the erasing voltage is applied, the memory cell 210 exhibits behavior similar to that illustrated in FIG. 10. When the voltage and the current reach, respectively, the threshold voltage and the threshold current of the switch device 220, the switch device 220 is switched. As a result, sufficient amounts of the current and the voltage are applied to the memory device 30, and thus the memory device 30 makes a transition from the low-resistance state to the high-resistance state, which causes the data written into the memory device 30 to be erased. The erasing voltage becomes larger than the erasing voltage of FIG. 10 because of the increase in the threshold of the switch device 220.

When a large erasing voltage is further applied after the erasing operation is performed, re-switching occurs on the switch device 220. However, the threshold voltage is increased, and thus the withstand voltage of the excessive erasing of the memory cell 210 is improved to 8 V. Moreover, the margin MG is also improved to 2 V. This facilitates setting of the voltage that stably performs erasing, thus improving reliability of writing and erasing operation of the memory cell 210. Increasing the threshold voltage of the switch device 220 as mentioned above stabilizes the erasing of the memory device 30, thereby leading to stabilization of the rewriting operation of the memory cell 210. In a case where the switch device 220 of FIG. 11 is used in the memory cell 210, however, the writing voltage of the memory cell 210 becomes excessively large. To decrease the power consumption of the memory array operation and to achieve higher-speed operation, the operation voltage may be preferably reduced as much as possible.

In contrast, the switch device 20 of the present embodiment is switched at about 4 V on writing side, and is switched at about 5 V on erasing side, as with the switch device 120. This allows the writing voltage to be decreased to as low as 6 V, and the re-switching voltage on erasing side to be increased to as high as 8 V (FIG. 14). In addition, the erasing completion voltage is about 6 V, which allows the margin MG between the erasing voltage and the re-switching voltage to be large. This allows for stable erasing operation.

Next, a principle in which the IV characteristics illustrated in FIG. 14 are expressed in the memory cell 10 is described.

For example, as illustrated in FIG. 4 to FIG. 7, in a case where the voltage is applied to the memory cell 10 such that the voltage on the ion source layer 32B side becomes higher than the voltage on the resistance-change layer 32A side in the memory layer 32, such voltage application causes the writing operation in the memory cell 10. At this time, the switching characteristics of a layer or a region in which the voltage is relatively high are expressed in the switch layer 22 of FIG. 4 to FIG. 7. Therefore, the switching characteristics of the second layer 22B (the second region 22β) in the switch layer 22 of FIG. 4 and FIG. 7 or the second layer 22B (the first region 22α) in the switch layer 22 of FIG. 5 and FIG. 6 are expressed, and thus the threshold voltage on writing side is decreased, as with the switch device having a large composition ratio of the chalcogen element.

In addition, for example, as illustrated in FIG. 4 to FIG. 7, In a case where the voltage is applied to the memory cell 10 such that the voltage on the resistance-change layer 32A side becomes higher than the voltage on the ion source layer 32B side in the memory layer 32, such voltage application causes the erasing operation to be performed in the memory cell 10. At this time, the switching characteristics of a layer or a region in which the voltage is relatively high are expressed in the switch layer 22 of FIG. 4 to FIG. 7. Therefore, the switching characteristics of the first layer 22A (the first region 22α) in the switch layer 22 of FIG. 4 and FIG. 7 or the first layer 22A (the second region 22β) in the switch layer 22 of FIG. 5 and FIG. 6 are expressed, and thus the threshold voltage on erasing side is increased, as with the switch device having a small composition ratio of the chalcogen element.

Note that the writing voltage and the erasing voltage of the memory device 30 described here are merely examples, and each may be a value of, for example, about 0.2 V to about 5 V. Likewise, the switching threshold voltage of the switch device 20 may be a value of about 0.5 V to about 5 V. This allows for optional adjustment of the writing voltage and the erasing voltage of the memory cell 10; however, in the disclosure, as described above, the switching threshold voltage is made different between the positive bias direction and the negative bias direction, which makes it possible to stabilize the operation of the memory cell 10.

Next, effects of the memory cell array 1 according to the present embodiment are described.

In the present embodiment, the composition ratios of the one or more of chalcogen elements or the types of the one or more of chalcogen elements are different between the first region 22α close to the first electrode 21 in the switch layer 22 and the second region 22β close to the second electrode 23 in the switch layer 22. This makes it possible to set the composition ratios of the one or more of chalcogen elements or the types of the one or more of chalcogen elements in the first region 22α and the second region 22β such that the switch layer 22 has the asymmetric IV characteristics, for example, as illustrated in FIG. 13. As a result, it is possible to allow a threshold voltage on reset side in the switch device 20 to be larger than a threshold voltage on set side in the switch device 20. This makes it possible to suppress deterioration of the memory device 30 due to excessive erasing, and to perform the memory operation with high reliability.

2. Modification Examples

Modification examples of the memory cell array 1 according to the above-described embodiment are described below. Note that, in the following, components common to those of the above-described embodiment are denoted by the same reference numerals as those of the above-described embodiment. In addition, components different from those of the above-described embodiment are mainly described, and description of the components common to those of the above-described embodiment is appropriately omitted.

Modification Example A

Figure 15A:
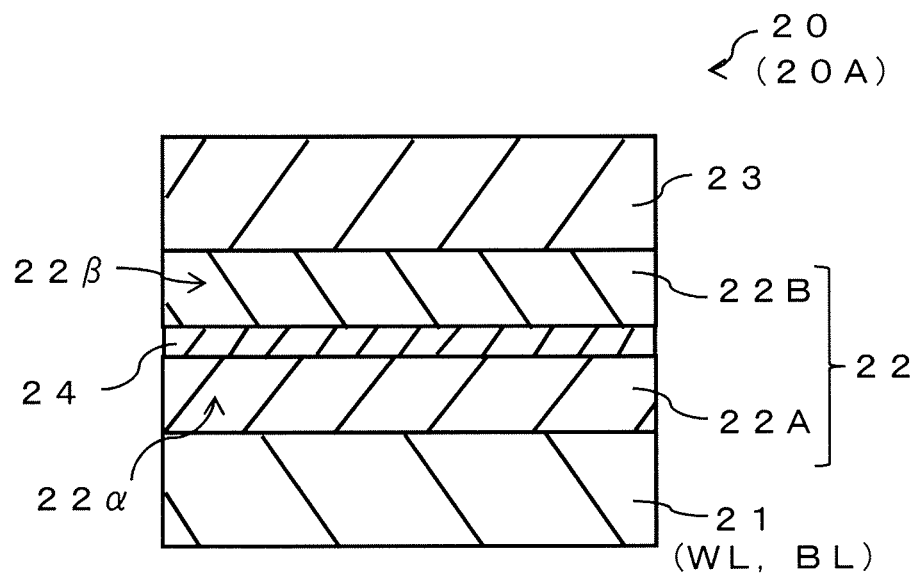
FIG. 15A illustrates a modification example of the cross-sectional configuration of the switch device of FIG. 2A.
Figure 15B:
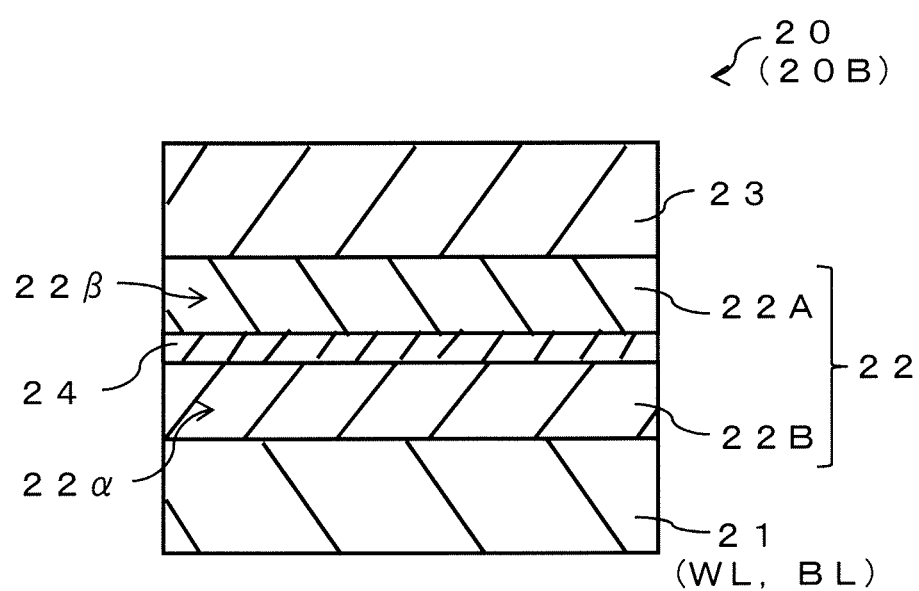
FIG. 15B illustrates a modification example of the cross-sectional configuration of the switch device of FIG. 2B.

FIG. 15A and FIG. 15B each illustrate a modification example of the switch device 20 according to the above-described embodiment. In the present modification example, the switch layer 22 includes a diffusion suppressing layer 24 that suppresses diffusion of the chalcogen elements or other component elements contained in the first region 22α and the second region 22β (or in the first layer 22A and the second layer 22B) between the first region 22α and the second region 22β or between the first layer 22A and the second layer 22B. The diffusion suppressing layer 24 contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

When the writing voltage Vw and the erasing voltage Vr are repeatedly applied to the memory cell 10, the chalcogen elements contained in the first layer 22A may be diffused into the second layer 22B, or the chalcogen elements and the other component elements contained in the second layer 22B may be diffused into the first layer 22A in some cases. In such cases, a difference between the composition ratios of the one or more of chalcogen elements contained in the first layer 22A and the composition ratios of the one or more of chalcogen elements contained in the second layer 22B is gradually decreased. When the asymmetric property of the IV characteristics of the switch layer 22 is impaired, the margin MG is decreased. In the present modification example, however, the provided diffusion suppressing layer 24 makes it possible to surely reduce such a possibility.

Modification Example B

Figure 16A:
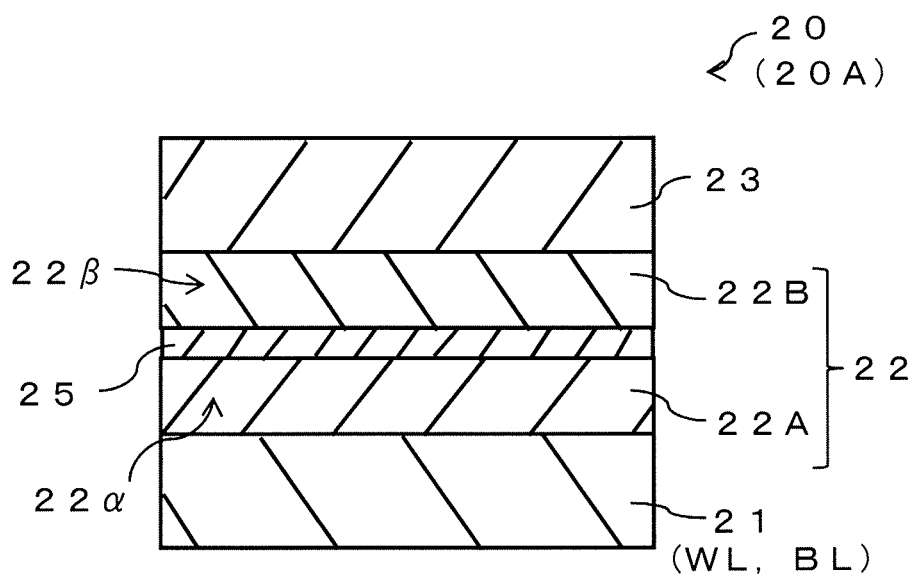
FIG. 16A illustrates a modification example of the cross-sectional configuration of the switch device of FIG. 2A.
Figure 16B:
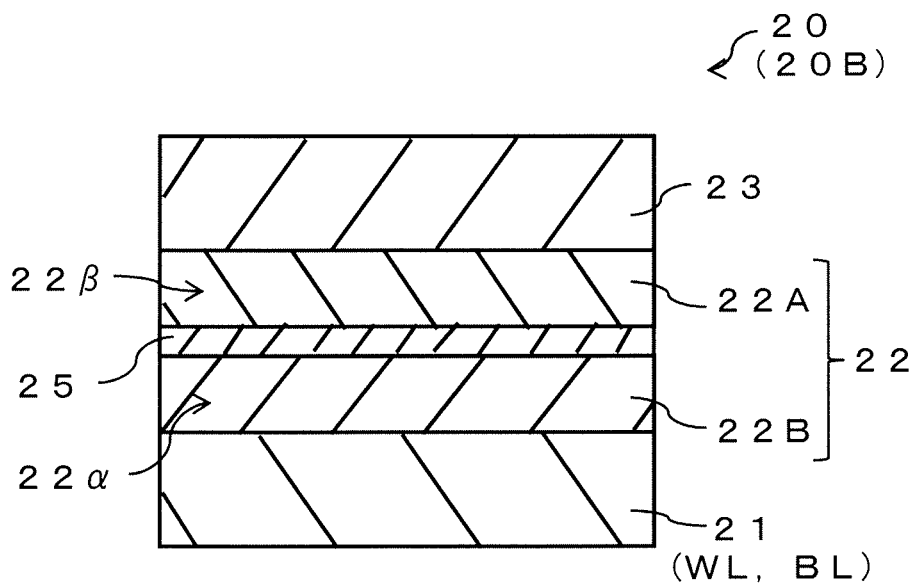
FIG. 16B illustrates a modification example of the cross-sectional configuration of the switch device of FIG. 2B.

FIG. 16A and FIG. 16B each illustrate a modification example of the switch device 20 according to the embodiment and Modification Example A described above. In the embodiment and Modification Example A described above, the switch layer 22 has the stacked structure in which the first layer 22A and the second layer 22B are stacked. In the embodiment and Modification Example A described above, however, the switch layer 22 may have a stacked structure in which three or more layers including the first layer 22A and the second layer 22B are stacked. For example, the switch layer 22 may be configured of three layers in which a fifth layer 25 is inserted between the first layer 22A and the second layer 22B. Even in this case, it is possible to suppress deterioration of the memory device 30 due to excessive erasing and to perform the memory operation with higher reliability, as with the above-described embodiment.

Modification Example C

Figure 17:
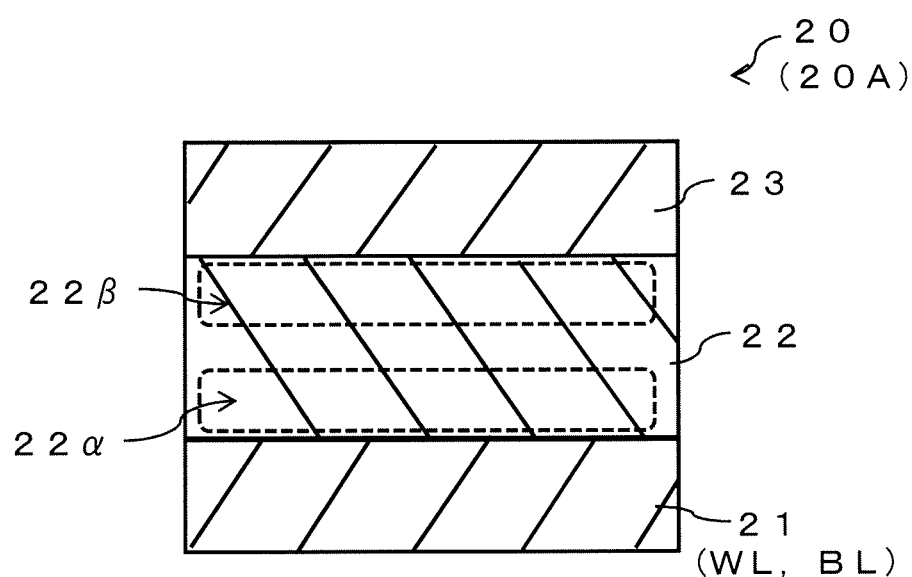
FIG. 17 illustrates a modification example of the cross-sectional configuration of the switch device of FIG. 2A or FIG. 2B.

FIG. 17 illustrates a modification example of the switch device 20 according to the embodiment and Modification Example A described above. In the embodiment and Modification Example A described above, the switch layer 22 has the stacked structure in which the first layer 22A and the second layer 22B are stacked. In the embodiment and Modification Example A described above, however, the switch layer 22 may be configured of a single layer in which the composition ratios of the one or more of chalcogen elements are different between the first region 22α and the second region 22β. In the present modification example, however, the switch layer 22 has a gradation structure in which the composition ratios of the one or more of chalcogen elements are continuously varied in the stacking direction of the switch device 20. Even in this case, it is possible to suppress deterioration of the memory device 30 due to excessive erasing and to perform the memory operation with high reliability, as with the above-described embodiment.

Modification Example D

In the embodiment and Modification Examples A to C described above, the memory layer 32 has the stacked structure in which the resistance-change layer 32A and the ion source layer 32B are stacked. In the embodiment and Modification Examples A to C described above, however, the memory layer 32 is not limited to such a structure, and may be, for example, a resistive random access memory using an oxide such as TaOx, HfOx, and TiOx, a phase-change memory using GeTeSb, etc., a spin-transfer torque MRAM (STT-MRAM) using a tunnel magnetoresistive device, a phase-change memory (PCM), or a resistive random access memory using a carbon material such as a carbon nanotube and graphene.

Modification Example E

In the embodiment and Modification Examples A to D described above, the case has been exemplified where the switch device 20 and the memory device 30 are stacked on each other. In the embodiment and Modification Examples A to D described above, however, a nonlinear resistive device may be interposed between the switch device 20 and the memory device 30. In addition, the switch device 20 and the memory device 30 may not necessarily share the electrode; the electrodes therefor may be formed separately.

Modification Example F

In the embodiment and Modification Examples A to E described above, the word lines WL or the bit lines BL may extend in the stacking direction of the memory cell array 1. In this case, each of the word lines WL and each of the bit lines BL face each other in the stacking in-plane direction of the memory cell array 1, and the switch device 20 and the memory device 30 included in each of the memory cells 10 are coupled in series in the stacking in-plane direction of the memory cell array 1.

3. Example

Next, Example of the memory cell array 1 according to the above-described embodiment is described with reference to a comparative example.

Three Samples 01 to 03 were prepared. A method of manufacturing these Samples 01 to 03 is described below.

Sample 01 was manufactured in the following manner. First, a TiN layer was formed on a substrate, and a BCTeN layer (specifically, $B_{40}C_{13}Te_{17}N_{30}$ layer) having a thickness of 20 nm was then formed on a surface of the TiN layer. Next, a W layer was formed on a surface of the BCTeN layer. Thereafter, a stacked body configured of the TiN layer, the BCTeN layer, and the W layer was selectively etched with use of an existing technology such as photolithography and dry etching, to form, on the substrate, a plurality of switch devices 20 according to the comparative example. The sample formed in such a manner was referred to as Sample 01.

Sample 02 was manufactured in the following manner. First, a TiN layer is formed on a substrate, and a first BCTeN layer (specifically, $B_{40}C_{13}Te_{17}N_{30}$ layer) having a thickness of 10 nm was then formed on a surface of the TiN layer. Subsequently, a second BCTeN layer (specifically, $B_{43}C_{14}Te_7N_{36}$ layer) having a thickness of 10 nm was formed. Next, a W layer was formed on a surface of the second BCTeN layer. Thereafter, a stacked body configured of the TiN layer, the two BCTeN layer having different composition ratios, and the W layer was selectively etched with use of an existing technology such as photolithography and dry etching to form, on the substrate, a plurality of switch devices 20 each including the switch layer 22 that was configured of the two BCTeN layers having different composition ratios. The sample formed in such a manner was referred to as Sample 02.

Sample 03 was manufactured in the following manner. First, a TiN layer was formed on a substrate, and a first BCTeN layer (specifically, $B_{43}C_{14}Te_7N_{36}$ layer) having a thickness of 10 nm was then formed on a surface of the TiN layer. Subsequently, a second BCTeN layer (specifically, $B_{40}C_{13}Te_{17}N_{30}$ layer) having a thickness of 10 nm was formed. Next, a W layer was formed on a surface of the second BCTeN layer. Thereafter, a stacked body configured of the TiN layer, the two BCTeN layers having different composition ratios, and the W layer was selectively etched with use of an existing technology such as photolithography and dry etching to form, on the substrate, a plurality of switch devices 20 each including a switch layer 22 that was configured of the two BCTeN layers having different composition ratios. The sample formed in such a manner was referred to as Sample 03.

Figure 18A:
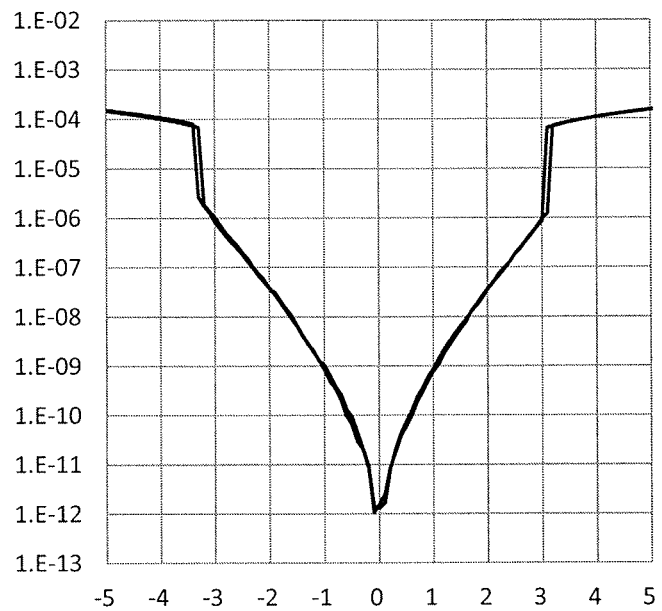
FIG. 18A illustrates an example of IV characteristics of Sample 01.
Figure 18B:
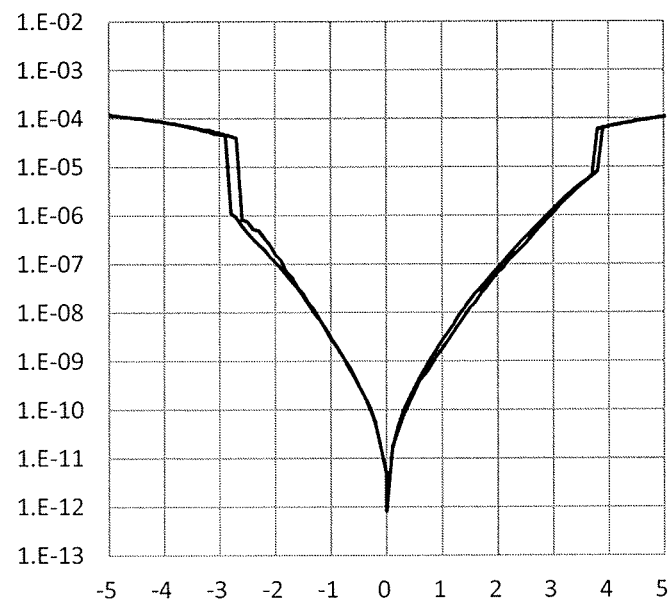
FIG. 18B illustrates an example of IV characteristics of Sample 02.
Figure 18C:
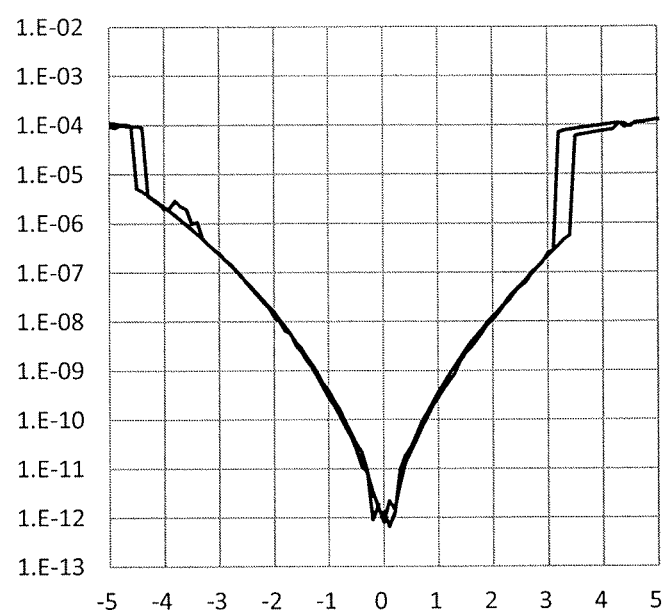
FIG. 18C illustrates an example of IV characteristics of Sample 03.

The IV characteristics of the switch device 20 in each of Samples 01 to 03 were measured, and results of the measurement were illustrated in FIG. 18A, FIG. 18B, and FIG. 18C. FIG. 18A illustrates the IV characteristics of Sample 01, FIG. 18B illustrates the IV characteristics of Sample 02, and FIG. 18C illustrates the IV characteristics of Sample 03. Note that, in each of Samples 01 to 03, the IV characteristics obtained when a positive voltage was applied to an electrode on an uppermost surface and an electrode on substrate side was set to the ground potential, were illustrated in a graph on right side in each diagram. Moreover, in each of Samples 01 to 03, the IV characteristics obtained when the electrode on the uppermost surface was set to the ground potential and a negative voltage was applied to the electrode on the substrate side, were illustrated in a graph on left side in each diagram.

It was appreciated from FIG. 18A that the switching voltage at the positive bias and the switching voltage at the negative bias were equal to each other in a case where the composition of the entire switch layer was substantially uniform. Further, it was appreciated from FIG. 18B that the absolute value of the switching voltage at the negative bias was smaller than the absolute value of the switching voltage at the positive bias in a case where the composition ratio of Te contained in the first BCTeN layer of the switch layer was larger than the composition ratio of Te contained in the second BCTeN layer of the switch layer. Furthermore, it was appreciated from FIG. 18C that the absolute value of the switching voltage at the negative bias was larger than the absolute value of the switching voltage at the positive bias In a case where the composition ratio of Te contained in the first BCTeN layer of the switch layer was smaller than the composition ratio of Te contained in the second BCTeN layer of the switch layer. Accordingly, by allowing the composition ratios of the one or more of chalcogen elements to be different in the stacking direction of the switch device 20 in the switch layer, it becomes possible to control the asymmetric property of the IV characteristics of the switch layer.

Although the technology has been described hereinbefore referring to the embodiment and the modification examples, the technology is not limited to the above-described embodiment and modification examples, and various modification examples may be made. Note that the effects described in the present specification are illustrative and non-limiting. Effects achieved by the technology are not limited to the effects described in the present specification. The technology may achieve effects other than the effects described in the present specification.

Note that the technology may also have the following configurations.

(1)

A switch device including:

a first electrode;

a second electrode that is disposed to face the first electrode; and a switch layer that is provided between the first electrode and the second electrode, and contains one or more of chalcogen elements selected from tellurium (Te), selenium (Se), and sulfur (S), the switch layer including a first region and a second region which have different composition ratios of the one or more of chalcogen elements or different types of the one or more of chalcogen elements, the first region being provided close to the first electrode, the second region being provided closer to the second electrode than the first region.

(2)

The switch device according to (1), in which the switch layer further contains one or more of incidental elements selected from boron (B), carbon (C), and silicon (Si), and the switch layer includes the first region and the second region which have different composition ratios of the one or more of incidental elements or different types of the one or more of incidental elements.

(3)

The switch device according to (1) or (2), in which the switch layer is changed into a low-resistance state by an increase in an absolute value of a first voltage to a first threshold voltage or higher, and is changed into a high-resistance state by a decrease in the absolute value of the first voltage to a voltage lower than the first threshold voltage when the first voltage is applied between the first electrode and the second electrode, the first voltage causing a voltage of the first electrode to be higher than a voltage of the second electrode, the switch layer is changed into the low-resistance state by an increase in an absolute value of a second voltage to a second threshold voltage or higher, and is changed into the high-resistance state by a decrease in the absolute value of the second voltage to a voltage lower than the second threshold voltage when the second voltage is applied between the first electrode and the second electrode, the second voltage causing the voltage of the second electrode to be higher than the voltage of the first electrode, and the switch layer includes the first region and the second region which have different composition ratios of the one or more of chalcogen elements or different types of the one or more of chalcogen elements to allow an absolute value of the first threshold voltage to be different from an absolute value of the second threshold voltage.

(4)

The switch device according to any one of (1) to (3), in which the switch layer includes a diffusion suppressing layer that suppresses diffusion of the chalcogen elements between the first region and the second region, the chalcogen elements being contained in the first region and the second region.

(5)

The switch device according to (4), in which the diffusion suppressing layer contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

(6)

A storage unit provided with a plurality of memory cells, each of the memory cells including a memory device and a switch device directly coupled to the memory device, the switch device including:

a first electrode;

a second electrode that is disposed to face the first electrode; and a switch layer that is provided between the first electrode and the second electrode, and contains one or more of chalcogen elements selected from tellurium (Te), selenium (Se), and sulfur (S), the switch layer including a first region and a second region which have different composition ratios of the one or more of chalcogen elements or different types of the one or more of chalcogen elements, the first region being provided close to the first electrode, the second region being provided closer to the second electrode than the first region.

(7)

The storage unit according to (6), in which the switch layer is changed into a low-resistance state by an increase in an absolute value of a third voltage between the first electrode and the second electrode, to a third threshold voltage or higher, and is changed into a high-resistance state by a decrease in the absolute value of the third voltage to a voltage lower than the third threshold voltage when a writing voltage is applied to corresponding one of the memory cells, the writing voltage decreasing resistance of the corresponding one of the memory cells, the switch layer is changed into the low-resistance state by an increase in an absolute value of a fourth voltage between the first electrode and the second electrode, to a fourth threshold voltage or higher, and is changed into the high-resistance state by a decrease in the absolute value of the fourth voltage to a voltage lower than the fourth threshold voltage when an erasing voltage is applied to the corresponding one of the memory cells, the erasing voltage increasing the resistance of the corresponding one of the memory cells, and the switch layer includes the first region and the second region which have different composition ratios of the one or more of chalcogen elements or different types of the one or more of chalcogen elements to allow an absolute value of the third threshold voltage to be different from an absolute value of the fourth threshold voltage.

(8)

The storage unit according to (7), in which the switch layer includes the first region and the second region which have different composition ratios of the one or more of chalcogen elements or different types of the one or more of chalcogen elements to allow the absolute value of the fourth threshold voltage to be larger than the absolute value of the third threshold voltage.

(9)

The storage unit according to any one of (6) to (8), in which the memory device includes a bidirectional resistive random access memory.

(10)

The storage unit according to (9), in which the memory device includes a chalcogenide layer serving as an ion source layer that supplies ions, the chalcogenide layer containing one or more of elements selected from copper (Cu), tellurium (Te), zirconium (Zr), and aluminum (Al), and an oxide layer serving as a resistance-change layer, the oxide layer containing aluminum (Al).

(11)

The storage unit according to (9), in which
the resistance-change layer is provided at a position closer to the switch device than the ion source layer, and
a region having a relatively small composition ratio of the one or more of chalcogen elements of the first region and the second region is disposed at a position distant from the memory device.

(12)

The storage unit according to (9), in which
the resistance-change layer is provided at a position more distant from the switch device than the ion source layer, and
a region having a relatively small composition ratio of the one or more of chalcogen elements of the first region and the second region is disposed at a position close to the memory device.

(13)

The storage unit according to any one of (6) to (12), further including:
a plurality of first wiring lines extending in a predetermined direction; and
a plurality of second wiring lines extending in a direction intersecting the first wiring lines, in which
each of the memory cells is provided at a position where each of the first wiring lines and each of the second wiring lines face each other.

This application is based upon and claims the benefit of priority of the Japanese Patent Application No. 2015-073053 filed with the Japan Patent Office on Mar. 31, 2015, the entire contents of which are incorporated herein by reference.

It should be understood by those skilled in the art that various modification examples, combinations, sub-combinations, and alterations may occur depending on design requirements and other factors insofar as they are within the scope of the appended claims or the equivalents thereof.

The invention claimed is:

1. A switch device comprising:
a first electrode;
a second electrode that is disposed to face the first electrode; and
a switch layer that is provided between the first electrode and the second electrode, and contains one or more of chalcogen elements selected from tellurium (Te), selenium (Se), and sulfur (S), wherein the switch device is a cross point in a cross point array structure, and wherein a threshold voltage on an erasing side in the switch device is larger than a threshold voltage on a writing side in the switch device.

2. The switch device according to claim 1, wherein
the switch layer includes a first region and a second region which have different composition ratios of the one or more of chalcogen elements or different types of the one or more of chalcogen elements, wherein the first region is provided close to the first electrode, and the second region is provided closer to the second electrode than the first region.

3. The switch device according to claim 2, wherein the switch layer includes a diffusion suppressing layer that suppresses diffusion of the chalcogen elements between the first region and the second region, the chalcogen elements being contained in the first region and the second region.

4. The switch device according to claim 3, wherein the diffusion suppressing layer contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

5. The switch device according to claim 1, wherein
the switch layer further contains one or more of incidental elements selected from boron (B), carbon (C), and silicon (Si), and
the switch layer includes a first region and a second region which have different composition ratios of the one or more of incidental elements or different types of the one or more of incidental elements.

6. The switch device according to claim 5, wherein the switch layer includes a diffusion suppressing layer that suppresses diffusion of the chalcogen elements between the first region and the second region, the chalcogen elements being contained in the first region and the second region.

7. The switch device according to claim 6, wherein the diffusion suppressing layer contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

8. The switch device according to claim 1, wherein
the switch layer is changed into a low-resistance state by an increase in an absolute value of a first voltage to a first threshold voltage or higher, and is changed into a high-resistance state by a decrease in the absolute value of the first voltage to a voltage lower than the first threshold voltage when the first voltage is applied between the first electrode and the second electrode, the first voltage causing a voltage of the first electrode to be higher than a voltage of the second electrode,
the switch layer is changed into the low-resistance state by an increase in an absolute value of a second voltage to a second threshold voltage or higher, and is changed into the high-resistance state by a decrease in the absolute value of the second voltage to a voltage lower than the second threshold voltage when the second voltage is applied between the first electrode and the second electrode, the second voltage causing the voltage of the second electrode to be higher than the voltage of the first electrode, and
the switch layer includes a first region and a second region which have different composition ratios of the one or more of chalcogen elements or different types of the one or more of chalcogen elements to allow an absolute value of the first threshold voltage to be different from an absolute value of the second threshold voltage.

9. The switch device according to claim 1, wherein
the switch layer includes a first region and a second region which have different composition ratios of the one or more of chalcogen elements or different types of the one or more of chalcogen elements, wherein the second region is provided closer to the second electrode than the first region.

10. The switch device according to claim 9, wherein the switch layer includes a diffusion suppressing layer that suppresses diffusion of the chalcogen elements between the first region and the second region, the chalcogen elements being contained in the first region and the second region.

11. The switch device according to claim 10, wherein the diffusion suppressing layer contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

12. The switch device according to claim 1, wherein
the switch layer includes a first region and a second region which have different composition ratios of the one or more of incidental elements or different types of the one or more of incidental elements.

13. A storage unit provided with a plurality of memory cells, each of the memory cells including a memory device and a switch device directly coupled to the memory device, the switch device comprising:
- a first electrode;
- a second electrode that is disposed to face the first electrode; and
- a switch layer that is provided between the first electrode and the second electrode, and contains one or more of chalcogen elements selected from tellurium (Te), selenium (Se), and sulfur (S), wherein the switch device is a cross point in a cross point array structure, and wherein a threshold voltage on an erasing side in the switch device is larger than a threshold voltage on a writing side in the switch device.

14. The storage unit according to claim 13, wherein
the switch layer includes a first region and a second region which have different composition ratios of the one or more of chalcogen elements or different types of the one or more of chalcogen elements, wherein the first region is provided close to the first electrode, and the second region is provided closer to the second electrode than the first region.

15. The storage unit according to claim 14, wherein the switch layer includes a diffusion suppressing layer that suppresses diffusion of the chalcogen elements between the first region and the second region, the chalcogen elements being contained in the first region and the second region.

16. The storage unit according to claim 15, wherein the diffusion suppressing layer contains tungsten (W), molybdenum (Mo), chromium (Cr), vanadium (V), niobium (Nb), tantalum (Ta), titanium (Ti), zirconium (Zr), hafnium (Hf), or a nitride of one or more of elements selected therefrom.

17. The storage unit according to claim 14, wherein the memory device comprises a bidirectional resistive random access memory.

18. The storage unit according to claim 13, wherein
the switch layer further contains one or more of incidental elements selected from boron (B), carbon (C), and silicon (Si), and
the switch layer includes a first region and a second region which have different composition ratios of the one or more of incidental elements or different types of the one or more of incidental elements.

19. The storage unit according to claim 13, wherein
the switch layer is changed into a low-resistance state by an increase in an absolute value of a first voltage to a first threshold voltage or higher, and is changed into a high-resistance state by a decrease in the absolute value of the first voltage to a voltage lower than the first threshold voltage when the first voltage is applied between the first electrode and the second electrode, the first voltage causing a voltage of the first electrode to be higher than a voltage of the second electrode,
the switch layer is changed into the low-resistance state by an increase in an absolute value of a second voltage to a second threshold voltage or higher, and is changed into the high-resistance state by a decrease in the absolute value of the second voltage to a voltage lower than the second threshold voltage when the second voltage is applied between the first electrode and the second electrode, the second voltage causing the voltage of the second electrode to be higher than the voltage of the first electrode, and
the switch layer includes a first region and a second region which have different composition ratios of the one or more of chalcogen elements or different types of the one or more of chalcogen elements to allow an absolute value of the first threshold voltage to be different from an absolute value of the second threshold voltage.

20. The storage unit according to claim 13, wherein the memory device comprises a bidirectional resistive random access memory.

* * * * *